(12) United States Patent
Ohmaru

(10) Patent No.: US 9,786,350 B2
(45) Date of Patent: Oct. 10, 2017

(54) MEMORY DEVICE

(71) Applicant: SEMICONDUCTOR ENERGY LABORATORY CO., LTD., Atsugi-Shi, Kanagawa-Ken (JP)

(72) Inventor: Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 126 days.

(21) Appl. No.: 14/208,714

(22) Filed: Mar. 13, 2014

(65) Prior Publication Data

US 2014/0269014 A1  Sep. 18, 2014

(30) Foreign Application Priority Data

Mar. 18, 2013  (JP) .................................. 2013-054496

(51) Int. Cl.
  *G11C 14/00* (2006.01)
  *G11C 11/24* (2006.01)
  (Continued)

(52) U.S. Cl.
  CPC ............ *G11C 11/24* (2013.01); *G11C 11/403* (2013.01); *G11C 14/0054* (2013.01);
  (Continued)

(58) Field of Classification Search
  CPC .................................................. G11C 14/0054
  (Continued)

(56) References Cited

U.S. PATENT DOCUMENTS 4,809,225 A * 2/1989 Dimmler ................. G11C 11/22
  365/149
5,675,529 A * 10/1997 Poole .................... G11C 11/419
  365/149
(Continued)

FOREIGN PATENT DOCUMENTS

EP  1737044 A  12/2006
EP  2226847 A  9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Hoai V Ho
*Assistant Examiner* — Jay Radke
(74) *Attorney, Agent, or Firm* — Fish & Richardson P.C.

(57) ABSTRACT

A memory device with a novel structure that is suitable for a register file is provided. The memory device includes a first memory circuit and a second memory circuit. The first memory circuit includes a first logic element and a second logic element each of which is configured to perform logic inversion, a selection circuit, a first switch, a second switch, and a third switch. The second memory circuit includes a first transistor in which a channel formation region is provided in an oxide semiconductor film, a second transistor, and a capacitor to which a potential is supplied through the first transistor.

14 Claims, 13 Drawing Sheets

(51) Int. Cl.
  *G11C 11/403* (2006.01)
  *H01L 27/12* (2006.01)
  *H01L 27/1156* (2017.01)

(52) U.S. Cl.
  CPC .... *H01L 27/1225* (2013.01); *G11C 2207/007* (2013.01); *H01L 27/1156* (2013.01)

(58) Field of Classification Search
  USPC .......................................................... 365/149
  See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,292,429 B1 * | 9/2001 | Furutani | G11C 7/1072 365/230.01 |
| 6,294,274 B1 | 9/2001 | Kawazoe et al. | |
| 6,473,476 B1 * | 10/2002 | Banks | G06F 1/24 327/117 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,313,768 B2 | 12/2007 | Mochizuki | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,411,813 B2 | 8/2008 | Maki | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,314,637 B2 | 11/2012 | Kato et al. | |
| 8,432,187 B2 | 4/2013 | Kato et al. | |
| 8,575,985 B2 | 11/2013 | Ohmaru et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0167399 A1 * | 7/2009 | Lu | H03H 11/26 327/281 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0128777 A1 * | 6/2011 | Yamazaki | G11C 11/405 365/149 |
| 2012/0140550 A1 | 6/2012 | Endo et al. | |
| 2012/0250397 A1 | 10/2012 | Ohmaru | |
| 2012/0271984 A1 | 10/2012 | Ohmaru et al. | |
| 2012/0294060 A1 | 11/2012 | Ohshima et al. | |
| 2013/0057315 A1 | 3/2013 | Kato et al. | |
| 2013/0234757 A1 | 9/2013 | Kato et al. | |
| 2014/0048802 A1 | 2/2014 | Ohmaru et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-102799 A | 4/2004 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2006-031767 A | 2/2006 |
| JP | 2013-009297 A | 1/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3-A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a $Zn4s$ conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Ando Koji; "Nonvolatile Magnetic Memory"; FED Review, vol. 1, No. 14; pp. 1-8; Mar. 2002; with English translation.

* cited by examiner

MEMORY DEVICE

BACKGROUND OF THE INVENTION

1. Field of the Invention

The present invention relates to an object, a method, or a manufacturing method. In addition, the present invention relates to a process, a machine, or manufacture. In particular, the present invention relates to, for example, a semiconductor device, a memory device, a display device, a light-emitting device, a power storage device, an electronic device, a driving method thereof, or a manufacturing method thereof. In particular, the present invention relates to a memory device and a semiconductor device using the memory device.

2. Description of the Related Art

In semiconductor devices such as central processing units (CPUs), semiconductor elements have been miniaturized and circuits have been made smaller in size to increase integration degree, and now transistors with a channel length of approximately 30 nm are manufactured. However, the miniaturization of the semiconductor elements increases power consumption (leakage power) due to leakage current of the transistors in the CPUs. Specifically, most of power consumption of conventional CPUs is power consumption (operation power) at the time of calculations, while leakage power accounts for at least 10% of power consumption of CPUs in recent years.

In particular, in a CPU for portable devices such as mobile phones and portable information terminals, registers and buffer memory devices such as caches occupy more than or equal to half a chip area of the CPU or use more than or equal to half the number of transistors; therefore, a reduction in leakage power of the buffer memory devices is highly demanding.

In view of the above, attention has been focused on a technique called "Normally-off Computing" which makes it possible to reduce power consumption by stopping power supply for a short time between processing periods of a processor with the use of power gating and a nonvolatile memory (Non-Patent Document 1).

In Normally-off Computing, a state before the power gating is retained in the nonvolatile memory to allow continuous processing of the processor.

As such a nonvolatile memory, a magnetic element or a ferroelectric element can be used; however, the use of such elements makes the manufacturing process of a semiconductor device complicated.

In addition, CPUs include register files as buffer memory devices. A register file is a circuit that can store data read from a main memory, data obtained during arithmetic processing of an arithmetic logic unit (ALU), data obtained as a result of the arithmetic processing of the ALU, and the like.

The register file includes a plurality of registers and is generally connected to a plurality of latches (Patent Document 1).

For example, Patent Document 1 discloses that a synchronous D-type flip-flop including a master latch that latches output of an OR circuit and a slave latch that follows the master latch is used for a memory portion of the register file.

A latch portion in Patent Document 1 includes a large number of elements and therefore has a problem of an increase in a layout area. When a nonvolatile memory is added to reduce leakage current, the circuit size is further increased.

Because the register file includes a plurality of registers, the layout area of the whole register file increases as the number of elements included in each register increases.

REFERENCE

Patent Document

[Patent Document 1] Japanese Published Patent Application No. 2004-102799

Non-Patent Document

[Non-Patent Document 1] Koji Ando, "FUKIHATSUSEI JIKIMEMORI" [Nonvolatile Magnetic Memory], *FED Review*, vol. 1, No. 14, 14 Mar. 2002.

SUMMARY OF THE INVENTION

In view of the foregoing technical background, an object of one embodiment of the present invention is to provide a memory device with a novel structure that has a relatively small circuit size.

Another object of one embodiment of the present invention is to provide a memory device with a novel structure in which the number of elements is reduced.

A further object of one embodiment of the present invention is to provide a memory device with a novel structure that makes it possible to reduce a layout area.

A still further object of one embodiment of the present invention is to provide a memory device with a novel structure that makes it possible to reduce power consumption.

A yet still further object of one embodiment of the present invention is to provide a novel semiconductor device or the like.

Note that the descriptions of these objects do not disturb the existence of other objects. Note that in one embodiment of the present invention, there is no need to achieve all the objects. Other objects are apparent from and can be derived from the description of the specification, the drawings, and the claims.

A memory device of one embodiment of the present invention includes a first memory circuit and a second memory circuit. The first memory circuit includes a first logic element, a second logic element, a selection circuit, a first switch, a second switch, and a third switch. The second memory circuit includes a first transistor in which a channel formation region is provided in an oxide semiconductor film and a capacitor to which a potential is supplied through the first transistor.

Alternatively, a memory device of one embodiment of the present invention includes a first logic element, a second logic element, a first switch, a second switch, a third switch, a selection circuit, and a memory circuit. An output terminal of the first logic element is electrically connected to one terminal of the first switch, an input terminal of the second logic element, and a first terminal of the memory circuit. An output terminal of the second logic element is electrically connected to a first input terminal of the selection circuit. A second input terminal of the selection circuit is electrically connected to a second terminal of the memory circuit. An output terminal of the selection circuit is electrically connected to one terminal of the second switch, one terminal of the third switch, and the input terminal of the second logic element. The first logic element and the second logic element are each configured to perform logic inversion. The memory circuit includes a first transistor in which a channel formation region is provided in an oxide semiconductor film and a capacitor to which a potential is supplied through the first transistor.

In addition, in the memory device of one embodiment of the present invention with the above-described structure, the memory circuit includes a second transistor. One of a source and a drain of the first transistor is electrically connected to the input terminal of the second logic element. The other of the source and the drain of the first transistor is electrically connected to one electrode of the capacitor and a gate of the second transistor. One of a source and a drain of the second transistor is electrically connected to the second input terminal of the selection circuit.

In the memory device of one embodiment of the present invention with the above-described structure, an inverter, a clocked inverter, or the like can be used as the first logic element. An inverter, a clocked inverter, or the like can be used as the second logic element. Further, as the second logic element, for example, a NAND including a second input terminal to which a signal is configured to be input can be used.

In the above-described structure, in addition to a transistor using an oxide semiconductor, for example, a transistor using a semiconductor including silicon can be used.

Note that functions of the "source" or "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that the term "connection" in this specification refers to electrical connection and corresponds to the state in which current, voltage, or a potential can be supplied or transmitted. Accordingly, a connection state means not only a state of direct connection but also a state of indirect connection through a circuit element such as a wiring, a resistor, a diode, or a transistor so that current, voltage, or a potential can be supplied or transmitted.

One embodiment of the present invention makes it possible to provide a memory device with a relatively small circuit size. Further, one embodiment of the present invention makes it possible to provide a memory device in which the number of elements is reduced. Furthermore, one embodiment of the present invention makes it possible to provide a memory device with low power consumption.

One embodiment of the present invention makes it possible to provide a memory device suitable for a register file.

One embodiment of the present invention makes it possible to provide a semiconductor device using a memory device with a novel structure.

DETAILED DESCRIPTION OF THE INVENTION

Figure 1:
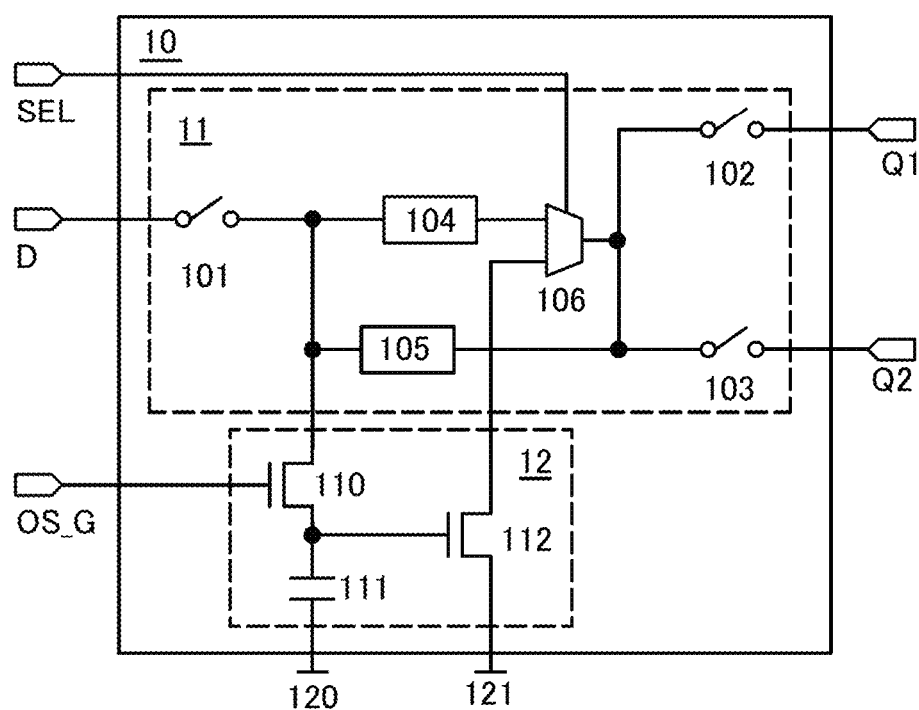
FIG. 1 illustrates an example of a memory device.

Examples of embodiments of the present invention will be described in detail with reference to the accompanying drawings. In the structures to be given below, the same portions or portions having similar functions are denoted by the same reference numerals in different drawings, and description thereof will not be repeated.

The present invention is not limited to the following description and it will be easily understood by those skilled in the art that modes and details can be modified in various ways without departing from the spirit and scope of the present invention. Therefore, the present invention should not be interpreted as being limited to the content of the embodiments below.

Note that the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

In this specification and the like, ordinal numbers such as "first", "second", "third", and the like are used in order to avoid confusion among components, and the terms do not limit the components numerically.

The present invention includes in its category semiconductor devices which can be used in integrated circuits such as microprocessors, image processing circuits, digital signal processors (DSPs), and microcontrollers; RF tags; display devices; and the like. The display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other display devices in which a memory device is included in a driver circuit or a control circuit.

Embodiment 1

In this embodiment, a structure of a memory device of one embodiment of the disclosed invention is described. Note that in a block diagram attached to this specification, components are classified according to their functions and shown as independent blocks; however, it is practically difficult to completely separate the components according to their functions, and one component may have a plurality of functions.

FIG. 1 illustrates one example of a structure of a memory device. A memory device 10 includes a memory circuit 11 and a memory circuit 12. A first terminal of the memory circuit 11 is connected to a first terminal of the memory circuit 12, and a second terminal of the memory circuit 11 is connected to a second terminal of the memory circuit 12.

The memory circuit 11 includes a logic element 104, a logic element 105, a selection circuit 106, a switch 101, a switch 102, and a switch 103. The logic element 105 and the logic element 104 can also be referred to as a first logic element and a second logic element, respectively. Note that the memory circuit 11 may further include another circuit element such as a diode, a resistor, or an inductor, as needed.

The memory circuit 11 is configured to retain data when a signal D that includes the data is input in a period during which a power supply voltage is supplied to the memory device 10. In addition, the memory circuit 11 can output one or both of a signal Q1 including data and a signal Q2 including data depending on the purpose of the operation of the memory device 10.

The selection circuit 106 is configured to output data retained in the memory circuit 11 or data retained in the memory circuit 12 in accordance with a signal SEL that selects data to be output.

The logic element 104 is configured to supply a signal obtained by logically inverting a signal corresponding to a potential supplied to an input terminal of the logic element 104 to a first input terminal of the selection circuit 106. As the logic element 104, an inverter, a clocked inverter, a NAND, or the like can be used.

The logic element 105 is configured to supply a signal obtained by logically inverting a signal corresponding to a potential supplied to an input terminal of the logic element 105 to the input terminal of the logic element 104. As the logic element 105, an inverter, a clocked inverter, or the like can be used.

In the memory circuit 11, specifically, an output terminal of the logic element 104 is connected to the first input terminal of the selection circuit 106, a second input terminal of the selection circuit 106 is connected to the second terminal of the memory circuit 12, an output terminal of the selection circuit 106 is connected to the input terminal of the logic element 105, and an output terminal of the logic element 105 is connected to the input terminal of the logic element 104 and the first terminal of the memory circuit 12.

The memory circuit 12 is configured to read data retained in the memory circuit 11 in the period during which the power supply voltage is supplied to the memory device 10 and save the data. The memory circuit 12 includes at least a capacitor 111 and a transistor 110 that controls supply, retention, and release of charge in the capacitor 111. Charge is supplied to the capacitor 111 through the transistor 110 which is in a conduction state in accordance with a potential corresponding to the data retained in the memory circuit 11; thus, the data retained in the memory circuit 11 can be saved in the memory circuit 12.

The memory circuit 12 may include a transistor 112 that reads data retained in the capacitor 111. Note that the memory circuit 12 may further include another circuit element such as a diode, a resistor, or an inductor, as needed.

In addition, the memory circuit 12 is configured to retain the saved data in a period during which the power supply voltage is not supplied to the memory device 10. Specifically, the transistor 110 is brought into a non-conduction state to keep the charge in the capacitor, whereby the data is retained.

Then, in a period during which the power supply voltage is supplied to the memory device 10 again, the data saved in the memory circuit 12 to be retained is read by the memory circuit 11 on the basis of the signal SEL to the selection circuit 106.

As the transistor 110 included in the memory circuit 12, a transistor with an extremely small off-state current is used. For example, a transistor in which a channel region is formed in a film of a semiconductor having a wider band gap and lower intrinsic carrier density than silicon has extremely small off-state current and thus is preferably used as the transistor 110. As such a semiconductor, for example, an oxide semiconductor, gallium nitride, and the like each having a band gap greater than or equal to twice the band gap of silicon can be given. A transistor including the semiconductor can have a much smaller off-state current than a transistor including a conventional semiconductor such as silicon or germanium. For this reason, the use of a transistor with the above-described structure in the memory circuit 12 can prevent leakage of charge held in the capacitor 111 in the memory circuit 12. Thus, the memory circuit 12 can retain the saved data for a long time.

In the memory circuit 12, specifically, one of a source and a drain of the transistor 110 is connected to the input terminal of the logic element 104; the other of the source and the drain of the transistor 110 is connected to one electrode of the capacitor 111 and a gate of the transistor 112; the other electrode of the capacitor 111 is connected to a wiring 120; one of a source and a drain of the transistor 112 is connected to the second input terminal of the selection circuit 106; and the other of the source and the drain of the transistor 112 is connected to a wiring 121. A signal OS_G for controlling conduction and non-conduction of the transistor 110 is supplied to a gate of the transistor 110. A connection between the output terminal of the logic element 105 and the one of the source and the drain of the transistor 110 can be referred to as a connection between the first terminal of the memory circuit 11 and the first terminal of the memory circuit 12, which are not illustrated in FIG. 1. Further, a connection between the second input terminal of the selection circuit 106 and the one of the source and the drain of the transistor 112 can be referred to as a connection between the second terminal of the memory circuit 11 and the second terminal of the memory circuit 12, which are not illustrated in FIG. 1.

As the transistor 112, a transistor in which a channel is formed in silicon can be used, for example. The silicon may be amorphous silicon, polycrystalline silicon, or single crystal silicon. In particular, a transistor in which a channel is formed in single crystal silicon is preferable because of its high driving frequency.

Alternatively, a transistor in which a channel is formed in an oxide semiconductor can be used as the transistor 112. With miniaturization of a transistor, a gate leakage current might be caused. For this reason, the transistor in which a channel is formed in an oxide semiconductor is used as the transistor 112 to enable the memory circuit 12 to retain the saved data for a long time as compared to the case of using the transistor in which a channel is formed in silicon.

Figure 2:
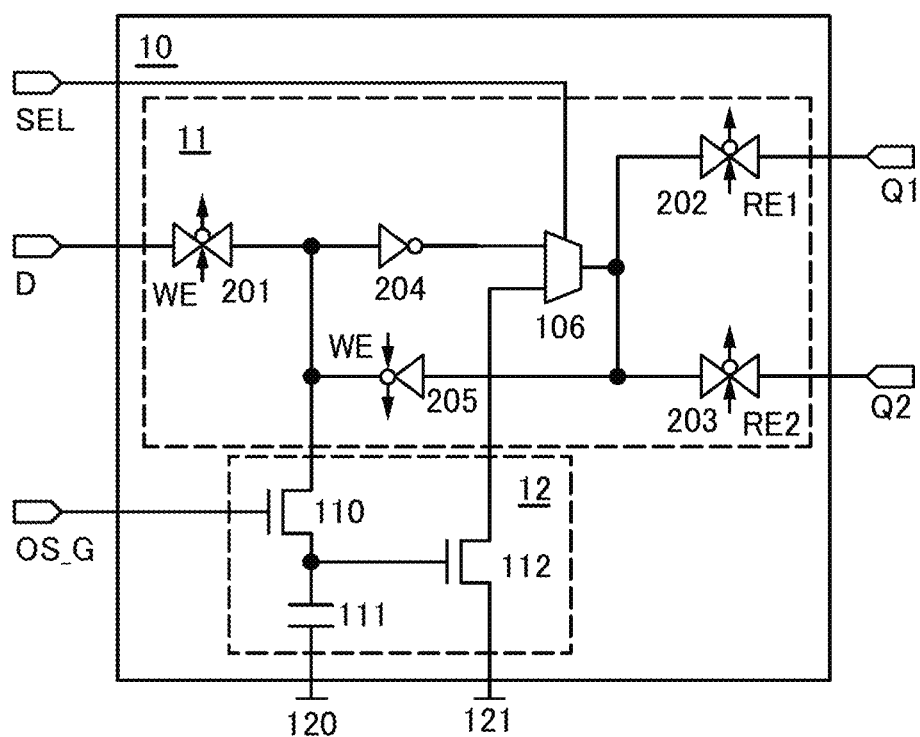
FIG. 2 illustrates an example of a memory device.

Next, a more specific example of the memory device 10 illustrated in FIG. 1 is illustrated in FIG. 2.

The memory device 10 includes the memory circuit 11 and the memory circuit 12. Note that the memory circuit 11 and the memory circuit 12 may each further include another circuit element such as a diode, a resistor, or an inductor, as needed. Further, some of the elements may be omitted or replaced with another circuit element.

The memory circuit 11 includes a transmission gate 201, a transmission gate 202, a transmission gate 203, an inverter 204, a clocked inverter 205, and the selection circuit 106. The memory circuit 12 includes the transistor 110, the transistor 112, and the capacitor 111.

The transmission gate 201 determines whether to output a signal in accordance with a signal WE. Specifically, the transmission gate 201 is configured to supply a signal D that includes data to an input terminal of the inverter 204 when the potential of the signal WE is at a high level. Further, the transmission gate 201 is configured to become high impedance and stop the supply of the signal D to the input terminal of the inverter 204 when the potential of the signal WE is at a low level.

The inverter 204 is configured to supply a signal obtained by logically inverting a signal corresponding to the potential supplied to the input terminal of the inverter 204 to the first input terminal of the selection circuit 106.

The clocked inverter 205 determines whether to output a signal in accordance with the signal WE. Specifically, the clocked inverter 205 is configured to supply a signal obtained by logically inverting a signal corresponding to a potential supplied to an input terminal of the clocked inverter 205 to an output terminal of the inverter 204 when the potential of the signal WE is at a low level. Further, the clocked inverter 205 is configured to become high impedance and stop the supply of the signal to the input terminal of the inverter 204 when the potential of the signal WE is at a high level.

The selection circuit 106 is configured to supply a signal supplied to the first input terminal of the selection circuit 106 or a signal supplied to the second input terminal of the selection circuit 106 to the input terminal of the clocked inverter 205, in accordance with the signal SEL. A signal based on data retained in the memory circuit 12 is supplied to the second input terminal of the selection circuit 106. Specifically, the second input terminal of the selection circuit 106 is connected to one of a source and a drain of the transistor 112, and when the transistor 112 is in an on state, a potential at a low level that is supplied to the wiring 121 connected to the other of the source and the drain of the transistor 112 is supplied to the second input terminal of the selection circuit 106.

Further, specifically, the selection circuit 106 can output a signal supplied to the first input terminal of the selection circuit 106 when the potential of the signal SEL is at a low level, and can output a signal supplied to the second input terminal of the selection circuit 106 when the potential of the signal SEL is at a high level.

The transmission gate 202 is a switch that determines whether to output a signal in accordance with a signal RE1. Specifically, the transmission gate 202 is configured to output a signal from the output terminal of the selection circuit 106 to an output terminal Q1 of the memory device 10 when the potential of the signal RE1 is at a high level. Further, the transmission gate 202 is configured to become high impedance and stop the output of the signal from the output terminal of the selection circuit 106 when the potential of the signal RE1 is at a low level.

The transmission gate 203 is a switch that determines whether to output a signal in accordance with a signal RE2. Specifically, the transmission gate 203 is configured to output a signal from the output terminal of the selection circuit 106 to an output terminal Q2 of the memory device 10 when the potential of the signal RE2 is at a high level. Further, the transmission gate 203 is configured to become high impedance and stop the output of the signal from the output terminal of the selection circuit 106 when the potential of the signal RE2 is at a low level.

Both of the transmission gate 202 and the transmission gate 203 are made to be in an on state to output the signals from the selection circuit 106 to the output terminal Q1 and the output terminal Q2 of the memory device 10 at the same time. Further, one of the transmission gate 202 and the transmission gate 203 is made to be in an on state and the other is made to be in an off state to output the signal from the output terminal of the selection circuit 106 to the output terminal (Q1 or Q2) of the memory device 10 through the transmission gate which is made to be in the on state.

The memory circuit 12 includes the n-channel transistor 110, the n-channel transistor 112, and the capacitor 111. Specifically, one of a source and a drain of the transistor 110 is connected to the input terminal of the inverter 204 and the output terminal of the clocked inverter 205. The other of the source and the drain of the transistor 110 is connected to one electrode of the capacitor 111 and a gate of the transistor 112. The signal OS_G is supplied to a gate of the transistor 110.

The other electrode of the capacitor 111 is connected to the wiring 120.

The one of the source and the drain of the transistor 112 is connected to the second input terminal of the selection circuit 106, and the other of the source and the drain of the transistor 112 is connected to the wiring 121.

Note that the wiring 120 and the wiring 121 may be connected to each other. A potential at a low level is supplied to each of the wiring 120 and the wiring 121.

In one embodiment of the present invention, the small off-state current of the transistor 110 allows the amount of charge that leaks from the capacitor 111 to be small. This makes it possible to ensure long-term retention of data in the memory circuit 12. A transistor in which a channel region is formed in a semiconductor film and has a wider band gap than silicon and a lower intrinsic carrier density than silicon can have an off-state current much smaller than that of a transistor in which a channel formation region is formed in a semiconductor film of silicon, germanium, or the like. Therefore, the former is suitable for the transistor 110.

In particular, a highly purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. For this reason, a transistor having a channel region in a highly purified oxide semiconductor film has extremely small off-state current and high reliability.

Figure 3:
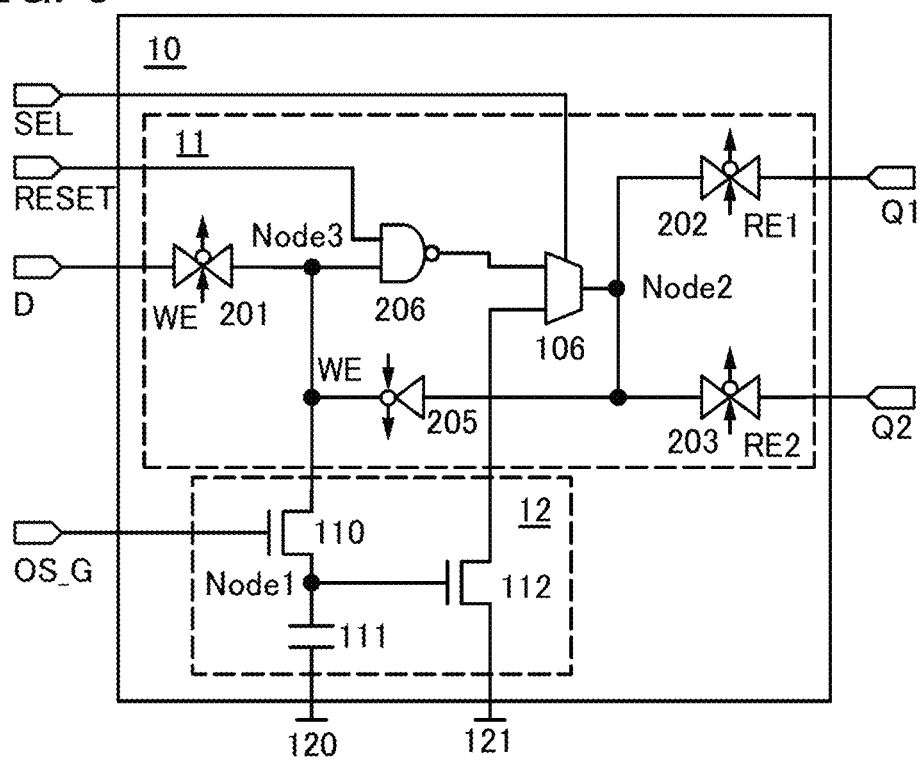
FIG. 3 illustrates an example of a memory device.

FIG. 3 illustrates an example of a memory device with a structure different from that in FIG. 2. Note that description of elements which are the same as those in the memory device in FIG. 2 is omitted here.

The memory circuit 11 in FIG. 3 includes a NAND 206 instead of the inverter 204 in FIG. 2. The NAND 206 is a 2-input NAND. A signal output from the clocked inverter 205 is input to a first input terminal of the NAND 206. A signal RESET is input to a second input terminal of the NAND 206. The NAND 206 can control the potential of a signal output from the NAND 206 in accordance with the signal RESET.

In one embodiment of the present invention, the number of elements in the memory circuit 11 can be smaller than that of a master slave flip-flop while excellent charge retention characteristics are exhibited; therefore, the circuit size can be relatively small.

Figure 4:
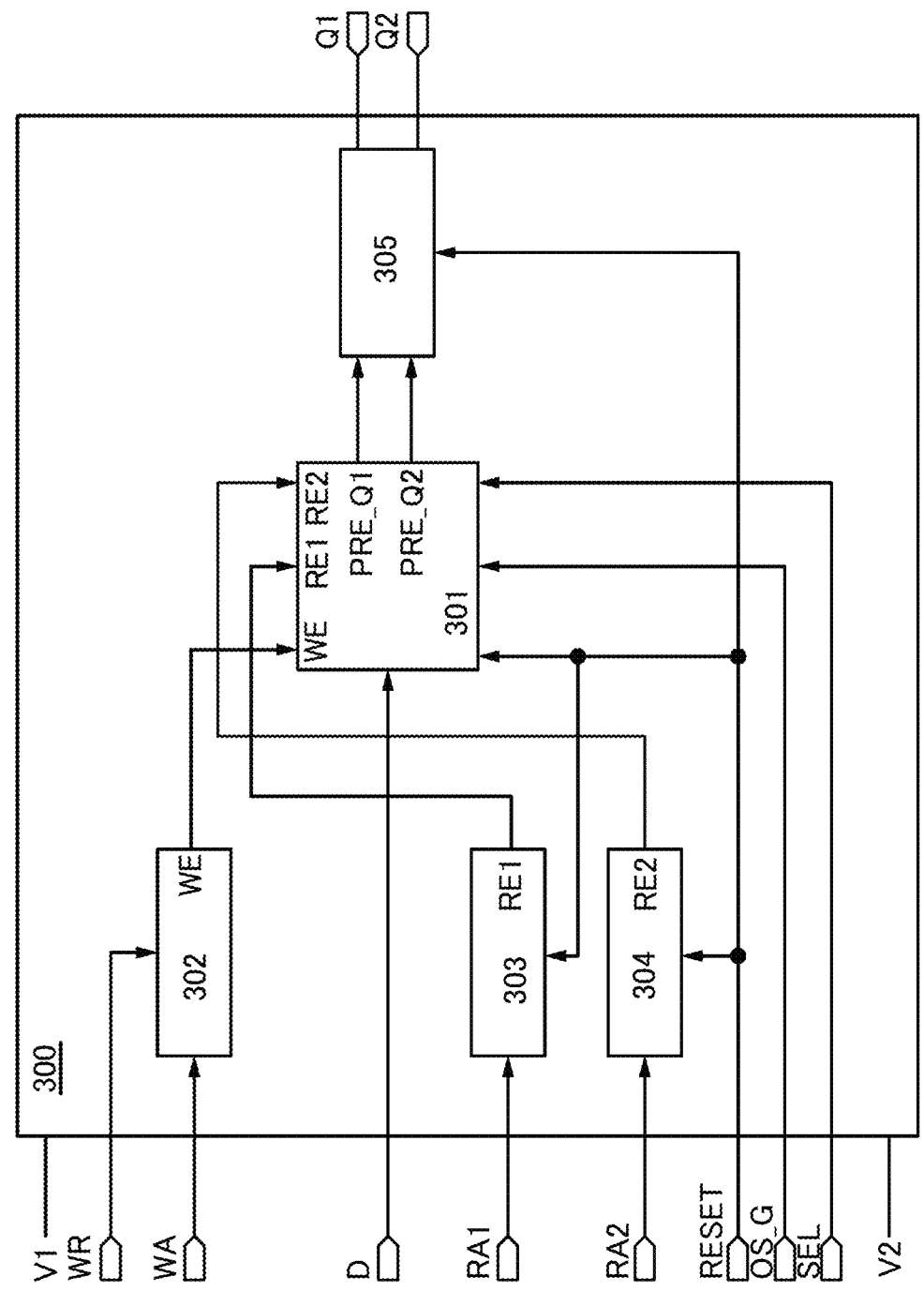
FIG. 4 illustrates an example of a memory device.

Next, FIG. 4 illustrates a block diagram of an example of using the memory device 10 in FIG. 1, FIG. 2, or FIG. 3 in a register file used in a CPU or the like.

A register file 300 includes a memory portion 301, a write control portion 302, a first read control portion 303, a second read control portion 304, and a data output portion 305. In addition, as a power supply voltage, the potential difference between a potential V1 and a potential V2 is supplied to the register file 300. One of the potential V1 and the potential V2 is at a high level, and the other is at a low level. The case where the potential V1 is at a high level and the potential V2 is at a low level is described below as an example.

The memory portion 301 is a circuit including a plurality of registers. The memory device illustrated in any of FIGS. 1 to 3 can be used as each register included in the memory portion 301.

The write control portion 302 is configured to start operation in accordance with a signal WR and generate the signal WE that determines to use a register corresponding to a writing address on the basis of a signal WA. For example, in the case where the memory portion 301 includes a first register and a second register and a calculation result is stored in the first register, the write control portion 302 can output the signal WE which determines to use the first register to the memory portion 301.

The first read control portion 303 is configured to generate the signal RE1 that determines to use a register corresponding to a reading address in accordance with a signal RA1. The second read control portion 304 is configured to generate the signal RE2 that determines to use a register corresponding to a reading address in accordance with a signal RA2. For example, in the case where the memory portion 301 includes the first register and the second register and the first item to be calculated is substituted from the first register, the first read control portion 303 sets the potential of the signal RE1 that determines to use the first register at a high level. Further, in the case where the second item to be calculated is substituted from the second register, the first read control portion 303 sets the potential of the signal RE2 that determines to use the second register at a high level.

A signal (PRE_Q1 and/or PRE_Q2) from the memory portion 301 is input to the data output portion 305. The data output portion 305 is configured to buffer or invert the signal to output a signal (Q1 and/or Q2).

Figure 5:
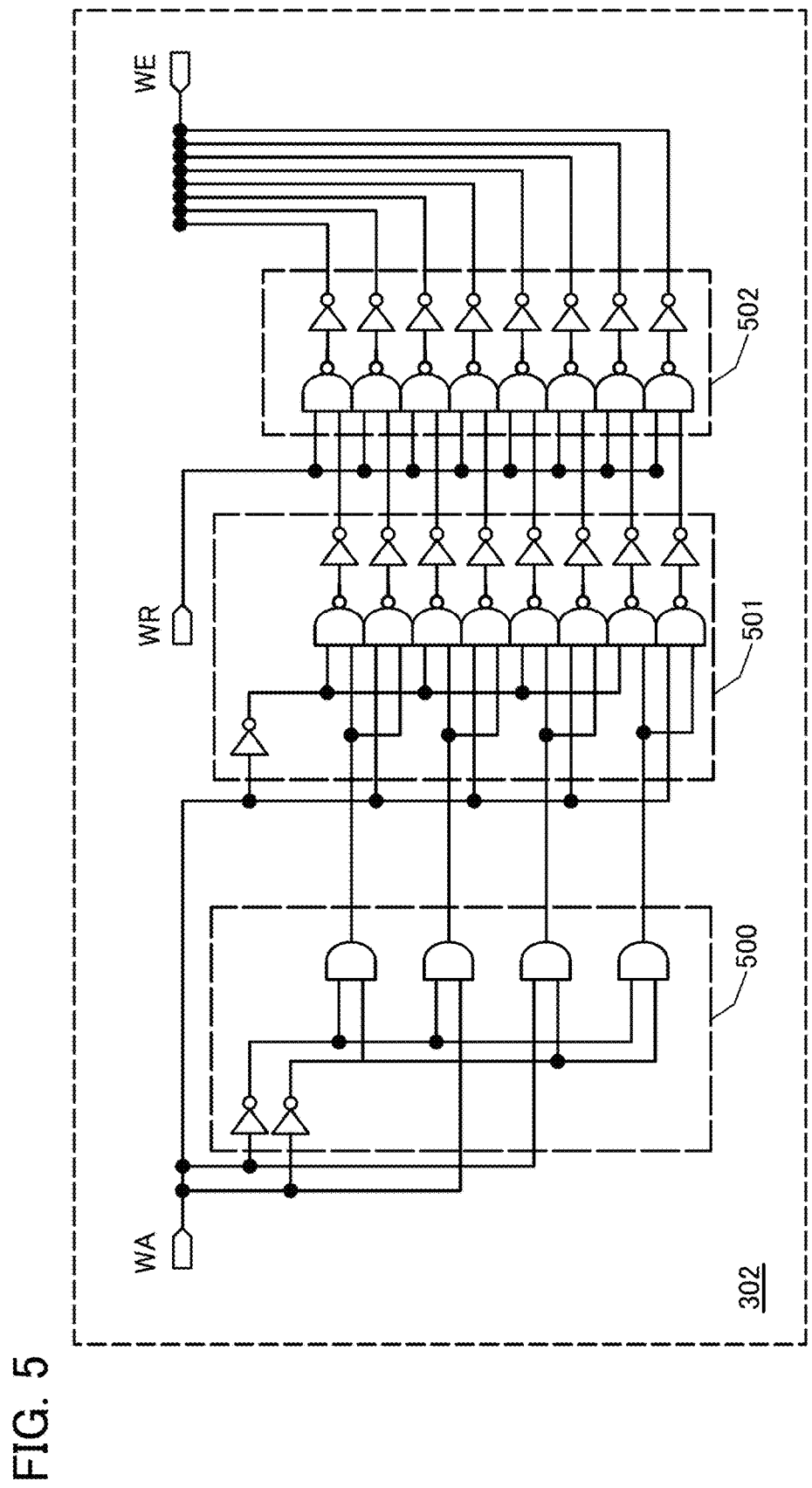
FIG. 5 illustrates an example of a memory device.

FIG. 5 illustrates an example of a specific structure of the write control portion 302 in FIG. 4. Here, the case of the register file 300 including eight 3-bit registers is shown as an example.

The write control portion 302 includes a logic circuit 500, a logic circuit 501, and a logic circuit 502. The signal WA is input to the logic circuit 500 and the logic circuit 501. The signal WR is input to the logic circuit 502. Specifically, in a period during which data is written to the memory portion 301, the potential of the signal WR is at a high level. In a period during which data is not written to the memory portion 301, the potential of the signal WR is at a low level. Here, a 3-bit signal is supplied as the signal WA and used to specify an address of any of the eight registers included in the memory portion 301. In a period during which the signal WA is supplied, the signal WE corresponding to the signal WA is output when the potential of the signal WR is at a high level.

Figure 6:
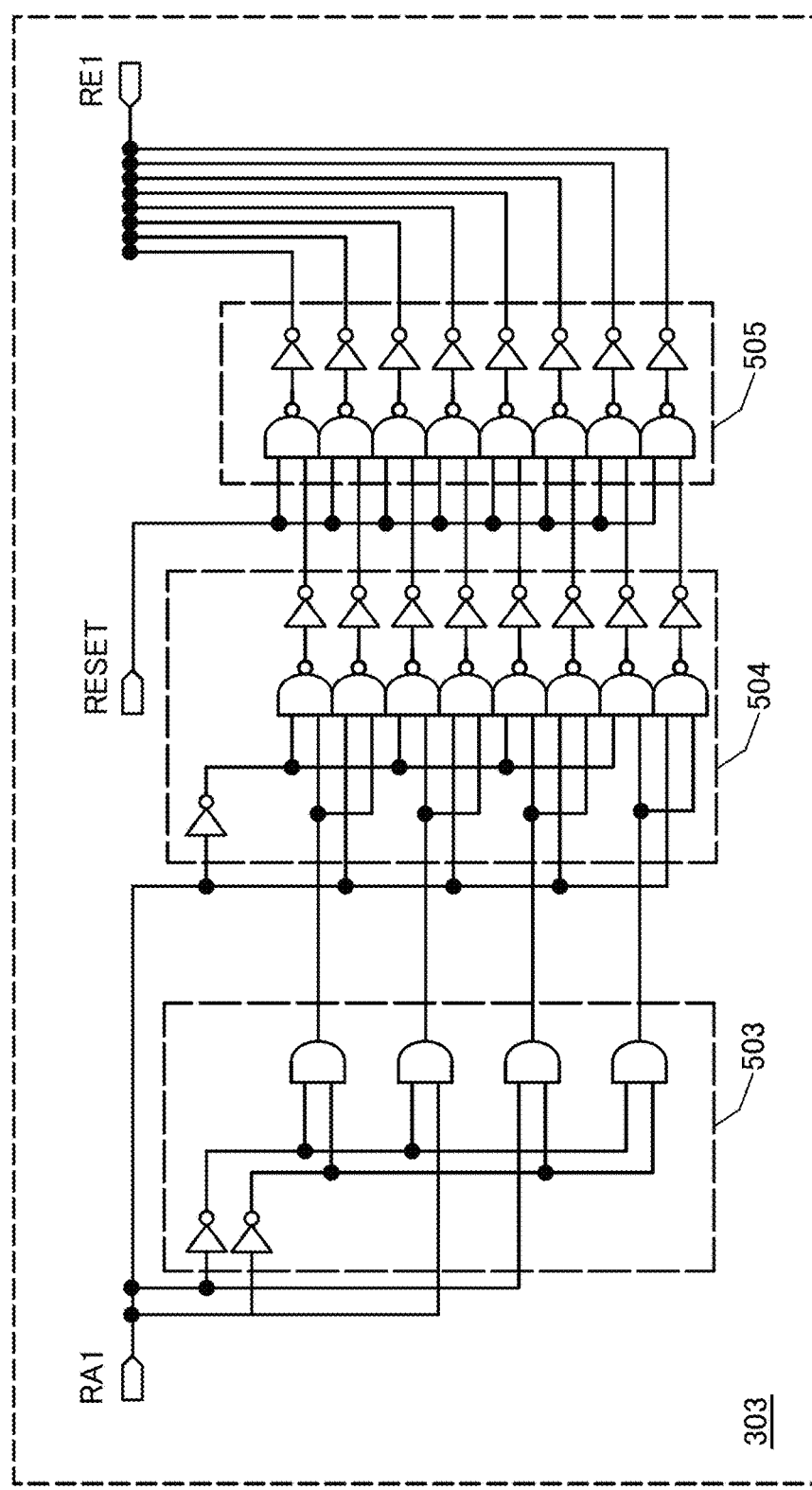
FIG. 6 illustrates an example of a memory device.

FIG. 6 illustrates an example of a specific structure of the first read control portion 303 in FIG. 4. Here, the case of the register file 300 including eight 3-bit registers is shown as an example.

The first read control portion 303 includes a logic circuit 503, a logic circuit 504, and a logic circuit 505. The signal RA1 is input to the logic circuit 503 and the logic circuit 504. The signal RESET is input to the logic circuit 505. Specifically, in a period during which data is read from the memory portion 301, the potential of the signal RESET is at a high level. In a period during which data is not read from the memory portion 301, the potential of the signal RESET is at a low level. Here, a 3-bit signal is supplied as the signal RA1 and used to specify an address of any of the eight registers included in the memory portion 301. In a period during which the signal RA1 is supplied, the signal RE1 corresponding to the signal RA1 is output when the potential of the signal RESET is at a high level.

Although only the first read control portion 303 is described with reference to FIG. 6, the second read control portion 304 has a structure similar to that of the first read control portion 303.

Figure 7:
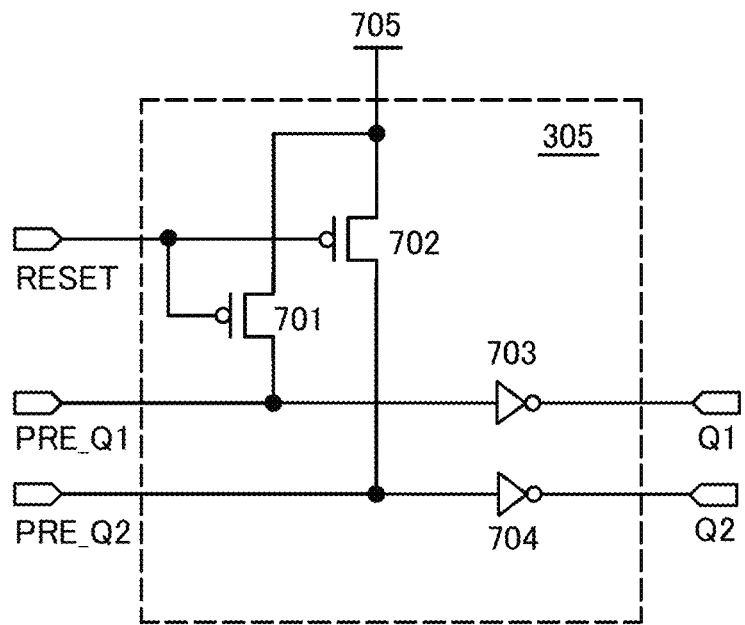
FIG. 7 illustrates an example of a memory device.

FIG. 7 illustrates an example of a specific circuit structure of the data output portion 305 in FIG. 4.

The data output portion 305 includes a p-channel transistor 701, a p-channel transistor 702, an inverter 703, and an inverter 704. Note that the data output portion 305 may further include another circuit element such as a diode, a resistor, or an inductor, as needed.

A gate of the transistor 701 is connected to a gate of the transistor 702. One of a source and a drain of the transistor 701 is connected to one of a source and a drain of the transistor 702. The other of the source and the drain of the transistor 701 is connected to an input terminal of the inverter 703. The other of the source and the drain of the transistor 702 is connected to an input terminal of the inverter 704. The one of the source and the drain of the transistor 701 and the one of the source and the drain of the transistor 702 are connected to a wiring 705. The potential V1 at a high level can be supplied to the wiring 705.

The inverter 703 is configured to output a signal from an output terminal; the signal is obtained by logically inverting a signal corresponding to a potential supplied to the input terminal of the inverter 703. The inverter 704 is configured to output a signal from an output terminal; the signal is obtained by logically inverting a signal corresponding to a potential supplied to the input terminal of the inverter 704.

The signal RESET for controlling an output signal of the selection circuit 106 is supplied to the gate of the transistor 701 and the gate of the transistor 702 in the data output portion 305. The signal RESET resets the signal (PRE_Q1 and/or PRE_Q2) output from the memory portion 301. Specifically, when the potential of the signal RESET is at a low level, a potential at a high level supplied to the wiring 705 is supplied to the input terminal of the inverter 703 and the input terminal of the inverter 704, so that signals at a low level which are logically inverted by the inverter 703 and the inverter 704 are output.

Figure 8:
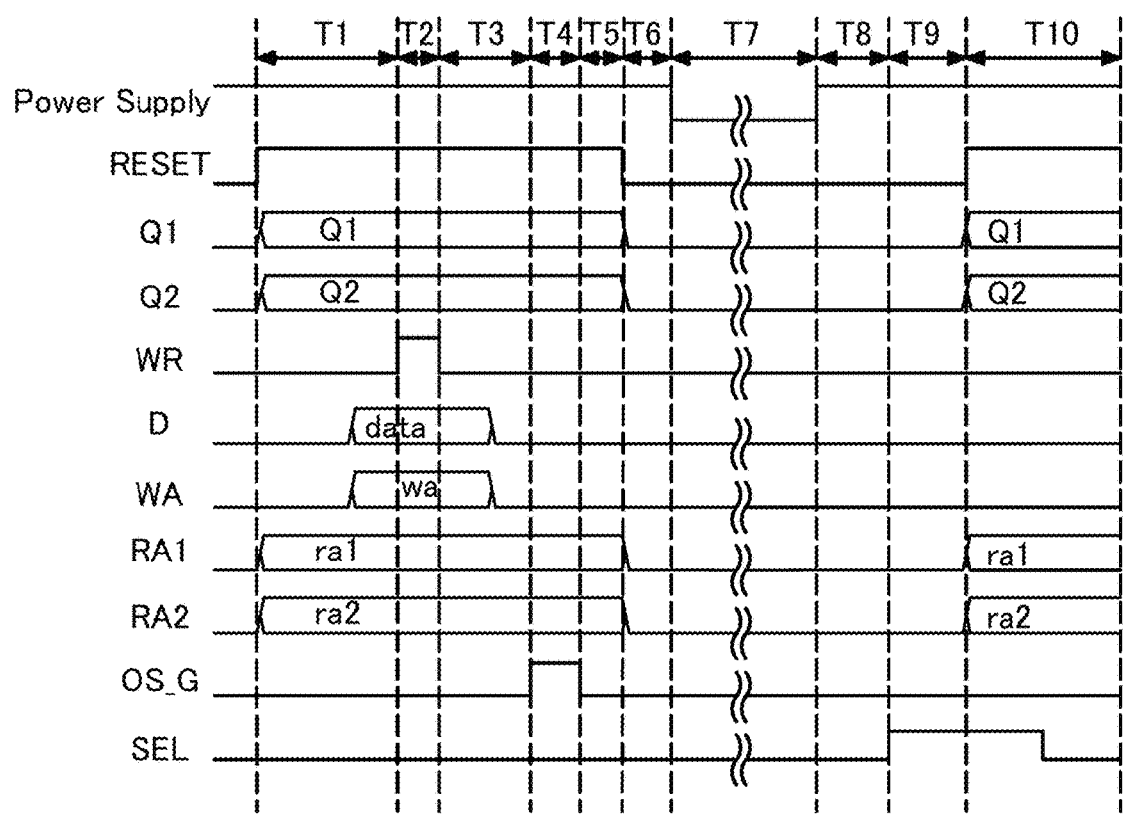
FIG. 8 illustrates an example of the timing chart of a memory device.

Next, description is given of an example of specific operations of the register file 300 in FIG. 4, which is a memory device, with reference to a timing chart in FIG. 8. Here, the memory portion 301 in FIG. 4 with the circuit configuration in FIG. 3 is described.

First, in periods T1 to T6, as a power supply voltage (Power Supply), the potential difference between the potential V1 at a high level and the potential V2 at a low level is supplied to the register file 300 which is the memory device.

In the period T1, the potential of the signal RESET is at a high level, and the signal RESET at the high level is supplied to the memory portion 301, the first read control portion 303, the second read control portion 304, and the data output portion 305. Specifically, a signal at a high level is input to the second input terminal of the NAND in the memory portion 301 to activate the first read control portion 303 and the second read control portion 304 and bring the transistor 701 and the transistor 702 in the data output portion 305 into a non-conduction state.

Further, in the period T1, the signal RA1 (denoted by "ra1" in FIG. 8) for generating the signal RE1 that determines to use any of the registers in the memory portion 301 is supplied to the first read control portion 303, and the signal RA2 (denoted by "ra2" in FIG. 8) for generating the signal RE2 that determines to use any of the registers in the memory portion 301 is supplied to the second read control portion 304.

Then, in the period T1, a signal that includes data (denoted by "data" in FIG. 8) is supplied to the memory portion 301, and the signal WA (denoted by "wa" in FIG. 8) for generating the signal WE that selects a writing address is supplied to the write control portion 302.

In the period T2, the potential of the signal WR is changed from a low level to a high level. Accordingly, the write control portion 302 is activated to supply the signal D that includes data to a register selected by the signal WA. Specifically, a potential at a high level is supplied to the transmission gate 201 of the memory device 10 which is the register selected by the signal WA, so that the transmission gate 201 is brought into a conduction state; and a potential at a low level is supplied to the clocked inverter 205, so that the clocked inverter 205 becomes high impedance.

In the period T3, the potential of the signal WR is changed from a high level to a low level. Specifically, the transmission gate 201 becomes high impedance, and the clocked inverter 205 is brought into a conduction state. Then, the supply of the signal D that includes data and the supply of the signal WA are stopped later. Thus, the data written in the period T2 is retained in the memory circuit 11 of the memory device 10.

The period T4 is a period during which data is written in the memory circuit 12. In the period T4, the potential of the signal OS_G is changed from a low level to a high level. In the period T4, the transistor 110 is brought into a conduction state to apply a potential corresponding to data written in the memory circuit 11 to a node (Node 1). The potential corresponding to the data and applied to Node 1 is retained in the capacitor 111.

In the period T5, the potential of the signal OS_G is changed from a high level to a low level to bring the transistor 110 into a non-conduction state. Therefore, in the period T5, as in the period T4, the potential corresponding to the data is retained in Node 1.

In the period T6, the potential of the signal RESET is changed from a high level to a low level.

In the period T7, the supply of the power supply voltage to the memory device 10 is stopped. The potential of the signal OS_G input to the gate of the transistor 110 is kept at the low level. The potentials of the signal RESET and the signal SEL are also kept at the low level. In the period T7, regardless of the length of the period T7, the potential corresponding to the data saved in the memory circuit 12 from the memory circuit 11 is kept at Node 1. The transistor 110 includes an oxide semiconductor in the channel and thus has a leakage current much smaller than a transistor including silicon. This makes it possible to keep the potential retained in the capacitor 111 for a long time. Consequently, in the memory device 10, data saved in the memory circuit 12 can be retained for a long time even after the supply of the power supply voltage is stopped.

Next, in periods T8 to T10, the supply of the power supply voltage is restarted.

In the period T8, the potential of the signal OS_G input to the gate of the transistor 110 is kept at the low level. The potentials of the signal RESET and the signal SEL are also kept at the low level, and the signal RESET at the low level is supplied to the memory portion 301, the first read control portion 303, the second read control portion 304, and the data output portion 305. Specifically, a signal at the low level is supplied to the second input terminal of the NAND 206 in the memory portion 301, and the NAND 206 outputs a potential at a high level regardless of the potential of a signal input to the first input terminal of the NAND 206. The first read control portion 303 and the second read control portion 304 become nonactivated. The transistor 701 and the transistor 702 in the data output portion 305 are brought into a conduction state and a potential corresponding to a potential supplied to the wiring 705 is output as each of the signal Q1 and the signal Q2. For example, a potential at a high level is supplied to the wiring 705 to reset the potentials of the signal Q1 and the signal Q2 to a low level.

In the period T9, the potential of the signal SEL is changed from a low level to a high level. When the potential of the signal SEL is changed from the low level to the high level, connection between the output terminal of the selection circuit 106 and the first input terminal of the selection circuit 106 is switched to connection between the output terminal of the selection circuit 106 and the second input terminal of the selection circuit 106. In the period T9, when a potential at a high level is retained in Node 1, for example, the transistor 112 is brought into a conduction state to supply a potential at a low level supplied to the wiring 121 to the second input terminal of the selection circuit 106. Accordingly, the potential of Node 2 is at a low level, and the potential of Node 3 connected to the output terminal of the clocked inverter 205 is at a high level. Further, when a potential at a low level is retained in Node 1, for example, the transistor 112 is in a non-conduction state and the potential of Node 2 is kept at the high level.

In the period T10, the potential of the signal RESET is changed from a low level to a high level. A potential at a high level is supplied to the second input terminal of the NAND 206, so that the NAND 206 outputs a signal obtained by logically inverting a signal corresponding to a potential supplied to the first input terminal of the NAND 206. For example, when a potential at a high level is retained in Node 1, the potential of Node 2 is at a low level and the potential of Node 3 is at a high level. Accordingly, the potential of the output terminal of the NAND 206 is at a low level, and data corresponding to the high level is retained. Further, when a potential at a low level is retained in Node 1, for example, the potential of Node 2 is at a high level and the potential of Node 3 is at a low level. Accordingly, the potential of the output terminal of the NAND 206 is at a high level, and data corresponding to the low level is retained. Thus, in the periods T8 to T10, data saved in the memory circuit 12 when the supply of the power supply voltage to the memory device 10 is stopped can be restored in the memory circuit 11.

The memory device 10 can be used as a register, a cache memory, or the like included in a semiconductor device. In particular, the memory device 10 is preferably used in a register file included in a semiconductor device. The use of the memory device 10 of this embodiment in a semiconductor device can prevent data loss caused when the supply of the power supply voltage is stopped. The memory device 10 of this embodiment in which the selection circuit is used to determine whether the memory circuit 11 or the memory circuit 12 outputs data can have more excellent data retention characteristics and a smaller circuit size than those of a master slave flip-flop.

Note that description is given of the operations of the register file in which the memory device 10 illustrated in FIG. 3 is used as the register as an example with reference to FIG. 8; however, the use of the memory device 10 in FIG. 2 which includes the inverter 204 instead of the NAND 206 enables operations similar to the operations. When the inverter 204 is used, a signal corresponding to the signal RESET is input to a wiring to which the signal D that includes data is input. With the structure in FIG. 2, a circuit size can be much smaller than that of the memory device 10 in FIG. 3. On the other hand, with the structure in FIG. 3 including another wiring to which the signal RESET is input, the memory device 10 can operate at higher speed than the memory device 10 in FIG. 2.

This embodiment can be implemented in combination with any of the other embodiments and the example as appropriate.

Embodiment 2

Figure 9:
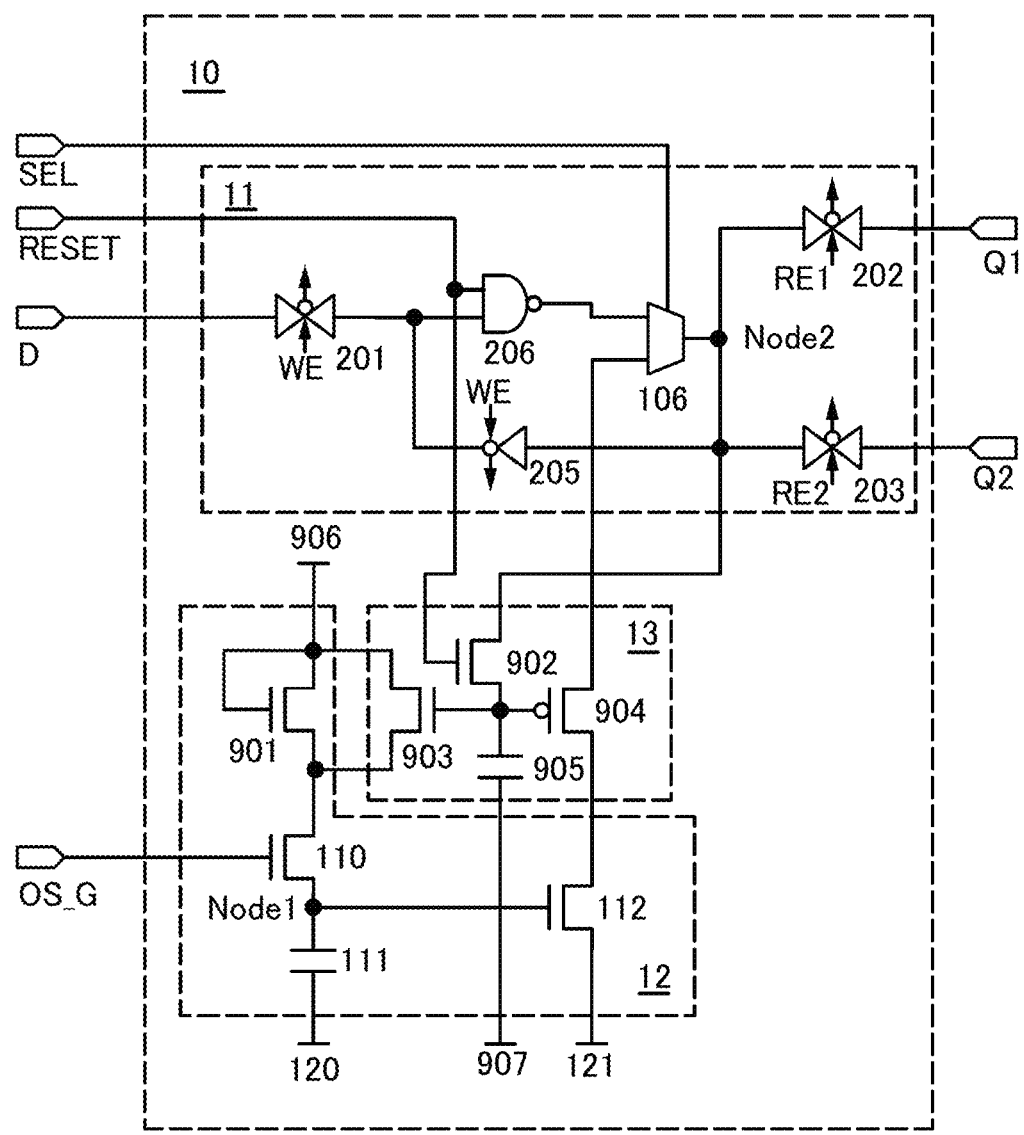
FIG. 9 illustrates an example of a memory device.

FIG. 9 illustrates an example of a memory device with a structure different from those in Embodiment 1.

The memory device 10 includes the memory circuit 11, the memory circuit 12, and a memory circuit 13.

The memory circuit 11 includes the transmission gates 201 to 203, the clocked inverter 205, the NAND 206, and the selection circuit 106.

The memory circuit 12 includes the n-channel transistor 110, the n-channel transistor 112, an n-channel transistor 901, and the capacitor 111. It is preferable that the off-state current of the transistor 110 be extremely small. For example, a channel region of the transistor 110 is preferably formed using an oxide semiconductor. In addition, a channel region of the transistor 112 is preferably formed using silicon, for example. Note that the channel region of the transistor 112 can be formed using an oxide semiconductor.

The memory circuit 13 includes an n-channel transistor 902, an n-channel transistor 903, a p-channel transistor 904, and a capacitor 905. It is preferable that the transistor 902 be possible to operate at high speed. For example, a channel region of the transistor 902 is preferably formed using silicon.

Note that although description is given on the assumption that each memory circuit includes the above-described elements, each memory circuit and the elements are formally separated. It is difficult to separate actual components completely, and one component might relate to a plurality of functions. For this reason, for example, the structure of the memory circuit 11 can be regarded as a structure including at least the inverter 204, the selection circuit 106, and the clocked inverter 205 or a structure including at least the NAND 206, the selection circuit 106, and the clocked inverter 205. The structure of the memory circuit 12 can be regarded as, for example, a structure including at least the transistor 110 and the capacitor 111. The structure of the memory circuit 13 can be regarded as, for example, a structure including at least the transistor 902 and the capacitor 905. It can be regarded that the memory device 10 includes at least a reading circuit including the transistor 904 and the transistor 112 so that the memory circuit 11 reads data saved in the memory circuit 12 or the memory circuit 13 in the period during which the supply of the power supply voltage is stopped.

One of a source and a drain of the transistor 901 is connected to a wiring 906, one of a source and a drain of the transistor 903, and a gate of the transistor 901. The other of the source and the drain of the transistor 901 is connected to one of the source and the drain of the transistor 110 and the other of the source and the drain of the transistor 903. The wiring 906 supplies a potential at a high level in the period during which the power supply voltage is supplied to the memory device 10. The wiring 906 supplies a potential at a low level (ground potential GND) in the period during which the power supply voltage is not supplied to the memory device 10.

One of a source and a drain of the transistor 902 is connected to the output terminal of the selection circuit 106. The other of the source and the drain of the transistor 902 is connected to a gate of the transistor 903, a gate of the transistor 904, and one electrode of the capacitor 905. A gate of the transistor 902 is connected to the second input terminal of the NAND 206.

One of a source and a drain of the transistor 904 is connected to the second input terminal of the selection circuit 106, and the other of the source and the drain of the transistor 904 is connected to one of the source and the drain of the transistor 112.

The other electrode of the capacitor 905 is connected to a wiring 907. Note that the wiring 120, the wiring 121, and the wiring 907 may be connected to one another. The potential V2 at a low level is supplied to each of the wiring 120, the wiring 121, and the wiring 907.

The memory circuit 11 is configured to retain data when the signal D that includes the data is input in the period during which the power supply voltage is supplied to the memory device 10.

The memory circuit 13 is configured to read data retained in the memory circuit 11 in the period during which the power supply voltage is supplied to the memory device 10 and save the data. In addition, the memory circuit 13 is configured to retain the saved data in the period during which the power supply voltage is not supplied to the memory device 10. Specifically, in the memory circuit 13 including at least the transistor 902 and the capacitor 905, charge corresponding to data retained in the memory circuit 11 can be held in the capacitor 905.

The memory circuit 12 is configured to read data retained in the memory circuit 13 in the period during which the power supply voltage is not supplied to the memory device 10 and save the data. Specifically, in the memory circuit 12 including at least the transistor 110 and the capacitor 111, charge corresponding to data retained in the memory circuit 13 can be held in the capacitor 111.

Next, an example of specific operations of the memory device 10 in FIG. 9 is described.

When the potential of the signal RESET is at a high level, the transistor 902 is brought into a conduction state. Then, a potential corresponding to a signal obtained by inverting the signal D that includes data is supplied from the output terminal of the NAND 206 to the one electrode of the capacitor 905 through the selection circuit 106 and the transistor 902. When the potential of the signal RESET is changed from a high level to a low level, the transistor 902 is brought into a non-conduction state, whereby data corresponding to data retained in the memory circuit 11 can be retained in the capacitor 905.

When a potential at a high level as the signal OS_G is supplied to the gate of the transistor 110, the transistor 110 is brought into a conduction state. The potential V1 at a high level is supplied to the wiring 906 in the period during which the power supply voltage is supplied to the memory device 10, and the potential V2 at a low level is supplied to the wiring 906 in the period during which the power supply voltage is not supplied to the memory device 10. In the period during which the power supply voltage is supplied to the memory device 10, the potential at a high level supplied to the wiring 906 is supplied to Node 1 through the source and the drain of the transistor 901 which is a diode-connected transistor. When the potential of Node 1 is at a high level, the transistor 112 is brought into a conduction state.

When the capacitor 905 in the memory circuit 13 retains a potential at a low level, the transistor 904 is brought into a conduction state to input the potential at the low level supplied to the wiring 121 to the second input terminal of the selection circuit 106 through the transistors 112 and 904. The change of the potential of the signal SEL from a low level to a high level allows a potential at a low level supplied to the second input terminal of the selection circuit 106 to be output from the output terminal of the selection circuit 106. Then, the potential of the signal RESET is changed from a low level to a high level, so that the potential of the output terminal of the NAND 206 is set at a low level. Then, the potential of the signal SEL is changed from a high level to a low level, whereby data is retained in the memory circuit 11. Thus, the memory circuit 11 can read data saved in the memory circuit 13.

When the capacitor 905 of the memory circuit 13 retains a potential at a high level, the transistor 904 is brought into a non-conduction state. When the potential of the signal RESET is at a low level and the potential of the signal SEL is at a low level (which corresponds to the period T8 in FIG. 8), the potentials of the output terminal of the NAND 206 and the output terminal of the selection circuit 106 are at a high level. In addition, the potential of the first input terminal of the NAND 206 is at a low level. When the potential of the signal SEL is changed from a low level to a high level, the output terminal of the selection circuit 106 and the second input terminal of the selection circuit 106 are brought into a conduction state. The transistor 904 is in a non-conduction state, so that the potential of the output terminal of the selection circuit 106 is kept at a high level. Then, the potential of the signal RESET is changed from a low level to a high level. The potential of the output terminal of the NAND 206 is kept at a high level because a potential at a low level is supplied to the first input terminal of the NAND 206. Next, the potential of the signal SEL is changed from a high level to a low level, whereby the first input terminal of the selection circuit 106 and the output terminal of the selection circuit 106 are brought into a conduction state, and data is retained in the memory circuit 11. Thus, the memory circuit 11 can read data saved in the memory circuit 13.

In the memory circuit 12, the potential of the signal OS_G is changed from a high level to a low level while a potential at a high level is supplied to Node 1; thus, the potential at the high level is retained in Node 1. Then, the potential of the wiring 906 is changed from a high level to a low level, so that the transistor 901 is brought into a non-conduction state. At this time, the transistor 903 is brought into a conduction state or non-conduction state depending on a potential retained in the gate of the transistor 903. When the transistor 110 is brought into a conduction state while the transistor 903 is in a conduction state, a current corresponding to the potential at the high level retained in Node 1 flows into the wiring 906 through the transistors 110 and 903; thus, the potential of Node 1 is set at a low level. On the other hand, when the potential of the gate of the transistor 903 is at a low level, the transistor 903 is brought into a non-conduction state, and the potential of Node 1 is kept at the high level regardless of whether the transistor 110 is in a conduction state or in a non-conduction state. Thus, data corresponding to data in the memory circuit 13 is retained in the memory circuit 12.

In the memory device 10 illustrated in FIG. 9, an operation mode (a conduction state or a non-conduction state) of the transistor 112 is selected in accordance with the potential retained in the capacitor 111 or the gate capacitance of the transistor 112, and data is read from the memory circuit 12 to the memory circuit 11 on the basis of the selected operation mode. For this reason, the original data can be accurately read even when the potential retained in the capacitor 111 or the gate capacitance of the transistor 112 fluctuates to some degree.

In one embodiment of the present invention, the small off-state current of the transistor 110 leads to a reduction in the amount of charge leaked from the capacitor 111, thereby ensuring long-term retention of data in the memory circuit 12. A transistor in which a channel formation region is formed in a semiconductor film and has a wider band gap than silicon and a lower intrinsic carrier density than silicon can have an off-state current much smaller than that of a transistor in which a channel formation region is formed in a semiconductor film of silicon, germanium, or the like. Therefore, the former is suitable for the transistor 110.

In particular, a highly purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. For this reason, a transistor having a channel formation region in a highly purified oxide semiconductor film has extremely small off-state current and high reliability.

Further, the capacitance value of the capacitor 111 included in the memory circuit 12 is preferably higher than that of the capacitor 905 included in the memory circuit 13.

When the capacitance value of the capacitor 111 included in the memory circuit 12 is greater than that of the capacitor 905 included in the memory circuit 13, the memory circuit 12 can retain saved data longer than the memory circuit 13 can in the period during which the power supply voltage is not supplied to the memory device 10.

In addition, read time of the memory circuit 13 can be short because the capacitance value of the capacitor 905 is smaller than that of the capacitor 111. With the use of a transistor in which a channel region is provided in silicon as the transistor 902, the transistor 902 can be turned on or off at high speed. Although leakage current might be caused by using the transistor including silicon as the transistor 902, there is no problem about data retained in the memory circuit 13 when the supply of the power supply voltage is stopped for a short time.

This embodiment can be implemented combining with any of the other embodiments as appropriate.

Embodiment 3

In this embodiment, description is given of a specific embodiment of a CPU corresponding to one mode of a semiconductor device of the present invention.

Figure 10:
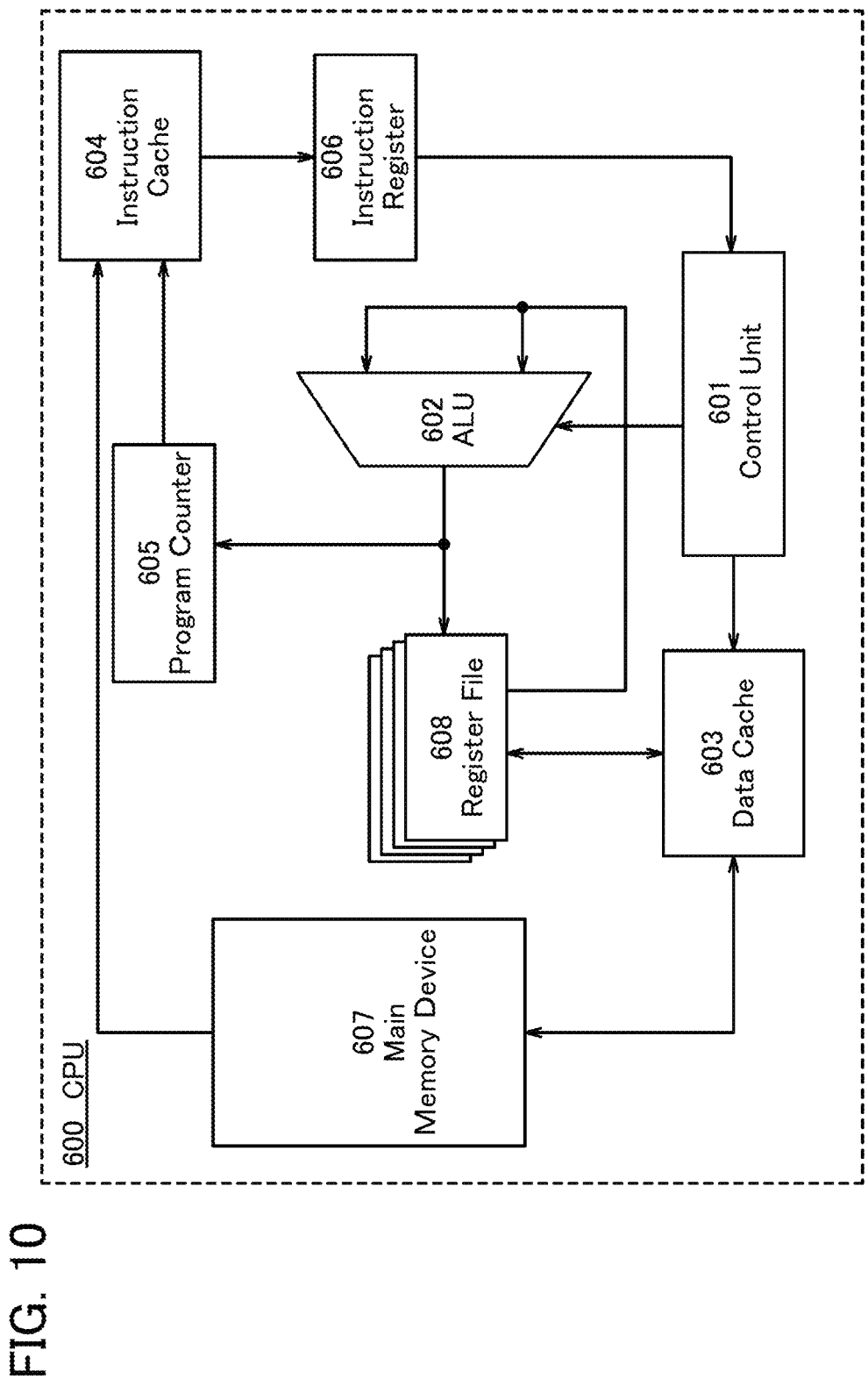
FIG. 10 illustrates an example of a semiconductor device.

FIG. 10 is a block diagram illustrating an example of a structure of a CPU. Although the block diagram attached to this specification illustrates components classified by their functions in independent blocks, it is difficult to classify actual components according to their functions completely and it is possible for one component to have a plurality of functions.

A CPU 600 includes a control unit 601, an arithmetic logic unit (ALU) 602 corresponding to an arithmetic unit, a data cache 603, an instruction cache 604, a program counter 605, an instruction register 606, a main memory device 607, and a register file 608.

The control unit 601 is configured to decode and carry out an instruction which is input. The ALU 602 is configured to perform a variety of arithmetic operations such as four arithmetic operations and logic operations.

The data cache 603 is a buffer memory device which temporary stores frequently-used data.

The instruction cache 604 is a buffer memory device which temporary stores frequently-used instructions of instructions (programs) sent to the control unit 601.

The program counter 605 is a register which stores an address of an instruction to be carried out next.

The instruction register 606 is a register which stores an instruction to be carried out next.

Data used for the arithmetic operations in the ALU 602 and an instruction which is carried out in the control unit 601 are stored in the main memory device 607.

The register file 608 includes a plurality of registers and can store data which is read from the main memory device 607, data which is obtained during the arithmetic operations in the ALU 602, data which is obtained as a result of the arithmetic operations in the ALU 602, and the like.

As the register file 608, any of the memory devices disclosed in this specification can be used. Note that any of the memory devices disclosed in this specification can be used as a component other than the register file 608, such as a register or a cache, if possible.

Next, the operations of the CPU 600 are described.

The control unit 601 reads an instruction from an address of the instruction cache 604 corresponding to the address of the instruction to be carried out next which is stored in the program counter 605, and makes the instruction register 606 store the instruction. When the instruction is not stored in the corresponding address of the instruction cache 604, the control unit 601 gets access to a corresponding address of the main memory device 607, reads the instruction from the main memory device 607, and makes the instruction register 606 store the instruction. In this case, the instruction is also stored in the instruction cache 604.

The control unit 601 decodes the instruction stored in the instruction register 606 and carries out the instruction. Specifically, the control unit 601 generates various signals for controlling the operation of the ALU 602 in accordance with the instruction.

When the instruction which is to be carried out is an arithmetic instruction, the control unit 601 makes the ALU 602 perform arithmetic operations using the data stored in the register file 608, and stores a result of the arithmetic operations in the register file 608.

When the instruction which is to be carried out is a loading instruction, the control unit 601, first, gets access to a corresponding address of the data cache 603, and checks whether or not a corresponding data exists in the data cache 603. When the corresponding data exists in the data cache 603, the data is copied from the corresponding address of the data cache 603 to the register file 608. When the corresponding data does not exist in the data cache 603, the data is copied from a corresponding address of the main memory device 607 to the corresponding address of the data cache 603, and then the data is copied from the corresponding address of the data cache 603 to the register file 608. Note that in the case where the corresponding data does not exist in the data cache 603, the control unit 601 needs to get access to the low-speed main memory device 607 as described above; therefore, it takes time to execute the instruction longer than in the case where the control unit gets access only to the buffer storage device such as the data cache 603. However, when not only the above data but also the address of the data and data of addresses of the vicinities of the data in the main memory device 607 are copied to the buffer memory device, second and the subsequent accesses to the address of the data and the addresses of the vicinities thereof in the main memory device 607 can be performed at high speed.

When the instruction which is to be carried out is a store instruction, the control unit 601 stores data of the register file 608 in a corresponding address of the data cache 603. In this case, the control unit 601, first, gets access to the corresponding address of the data cache 603 and checks whether or not the corresponding data can be stored in the data cache 603. When the data can be stored in the data cache 603, the data is copied from the register file 608 to the corresponding address of the data cache 603. When the data cannot be stored, a new corresponding address is assigned in part of the data cache 603, and the data is copied from the register file 608 to the corresponding address of the data cache 603. Note that the data may be copied to the main memory device 607 immediately after the data is copied to the data cache 603. Alternatively, some pieces of data may be copied to the data cache 603 and then the pieces of data may be collectively copied to the main memory device 607.

Then, after the control unit 601 carries out the instruction, the control unit 601 gets access to the program counter 605 again, and repeats the above operations in which an instruction read from the instruction register 606 is decoded and carried out.

In this embodiment, the use of any of the memory devices described in Embodiments 1 and 2 as the register file 608 can provide a semiconductor device in which the number of elements is reduced and whose layout area is reduced. Further, a semiconductor device with low power consumption can be provided. Furthermore, the use of a nonvolatile memory circuit in the memory device can prevent data loss that occurs in the register file.

This embodiment can be implemented combining with any of the other embodiments as appropriate.

Embodiment 4

An oxide semiconductor that can be used for a channel of the transistors in Embodiments 1 to 3 is described.

An oxide semiconductor to be used preferably contains at least indium (In) or zinc (Zn). The oxide semiconductor preferably contains, in addition to In and Zn, gallium (Ga) serving as a stabilizer that reduces variations in electric characteristics of the transistor using the oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

In—Ga—Zn-based oxide and In—Sn—Zn-based oxide among oxide semiconductors have the following advantages over silicon carbide, gallium nitride, and gallium oxide: transistors with excellent electrical characteristics can be formed by sputtering or a wet process and thus can be mass-produced easily. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn and there is no particular limitation on the ratio of In:Ga:Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to any of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or an oxide with an atomic ratio close to any of the above atomic ratios can be used.

For example, with an In—Sn—Zn-based oxide, high mobility can be obtained relatively easily. However, even with an In—Ga—Zn-based oxide, mobility can be increased by reducing the defect density in the bulk.

An oxide semiconductor film may be in a non-single-crystal state, for example. The non-single-crystal state is, for example, structured by at least one of a c-axis aligned crystal (CAAC), a polycrystal, a microcrystal, and an amorphous part. The density of defect states of an amorphous part is higher than those of a microcrystal and a CAAC. The density of defect states of a microcrystal is higher than that of a CAAC. Note that an oxide semiconductor including a CAAC is referred to as a c-axis aligned crystalline oxide semiconductor (CAAC-OS).

An oxide semiconductor film may include a CAAC-OS, for example. In the CAAC-OS, for example, c-axes are aligned, and a-axes and/or b-axes are not macroscopically aligned.

An oxide semiconductor film may include a microcrystal, for example. Note that an oxide semiconductor including a microcrystal is referred to as a microcrystalline oxide semiconductor. A microcrystalline oxide semiconductor film includes a microcrystal (also referred to as a nanocrystal) with a size greater than or equal to 1 nm and less than 10 nm, for example.

An oxide semiconductor film may include an amorphous part, for example. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, the c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With the use of the CAAC-OS film in a transistor, variation in electrical characteristics of the transistor due to irradiation with visible light or ultraviolet light is small. Thus, the transistor has high reliability.

For example, the CAAC-OS film is formed by sputtering with a polycrystalline metal oxide sputtering target.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of sputtered particles is likely to occur after the sputtered particles reach a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particles reach the substrate, migration occurs on the substrate, so that a flat plane of each flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

The oxide semiconductor film is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above oxide semiconductor film, when a voltage is applied to a gate electrode so that an electric field is applied to the semiconductor film, a channel region is formed in the second metal oxide film whose lowest conduction band energy is small in the semiconductor film. That is, since the third metal oxide film is provided between the second metal oxide film and a gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Further, it is preferable that a plurality of metal oxide films be stacked so that an interface level due to an impurity existing between the metal oxide films, which inhibits carrier flow, is not formed at the interface between the metal oxide films. This is because if impurities exist between the stacked metal oxide films, the continuity of the energy at the bottom of the conduction band between the metal oxide films is lost, and carriers are trapped or disappear by recombination in the vicinity of the interface. By reducing impurities existing between the films, a continuous junction (here, particularly a U-shape well structure with the energy at the bottom of the conduction band changed continuously between the films) is formed more easily than the case of merely stacking a plurality of metal oxide films that contain at least one common metal as a main component.

In order to form continuous junction, the films need to be stacked successively without being exposed to the air by using a multi-chamber deposition system (sputtering apparatus) provided with a load lock chamber. Each chamber of the sputtering apparatus is preferably evacuated to a high vacuum (to a vacuum of approximately $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a high-purity intrinsic oxide semiconductor. As an oxygen gas or an argon gas used as the sputtering gas, a gas that is highly purified to have a dew point of −40° C. or lower, preferably −80° C. or lower, more preferably −100° C. or lower is used, so that entry of moisture or the like into the oxide semiconductor film can be prevented as much as possible.

The first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film is preferably an oxide film with a content of any of the above elements 1.5 or more times, preferably 2 or more times, further preferably 3 or more times that of the second metal oxide film in an atomic ratio. The above element is strongly bonded to oxygen, and thus has a function of suppressing generation of oxygen vacancies in the oxide film. Accordingly, the first metal oxide film or the third metal oxide film can be an oxide film in which oxygen vacancies are less likely to be generated than in the second metal oxide film.

The first metal oxide film and the third metal oxide film each have a thickness greater than or equal to 3 nm and less than or equal to 100 nm, preferably greater than or equal to 3 nm and less than or equal to 50 nm. The second metal oxide film has a thickness greater than or equal to 3 nm and less than or equal to 200 nm, preferably greater than or equal to 3 nm and less than or equal to 100 nm, and more preferably greater than or equal to 3 nm and less than or equal to 50 nm.

In the three-layer semiconductor film, the first metal oxide film and the third metal oxide film can be amorphous or crystalline. Note that the second metal oxide film in which

Embodiment 5

Figure 11:
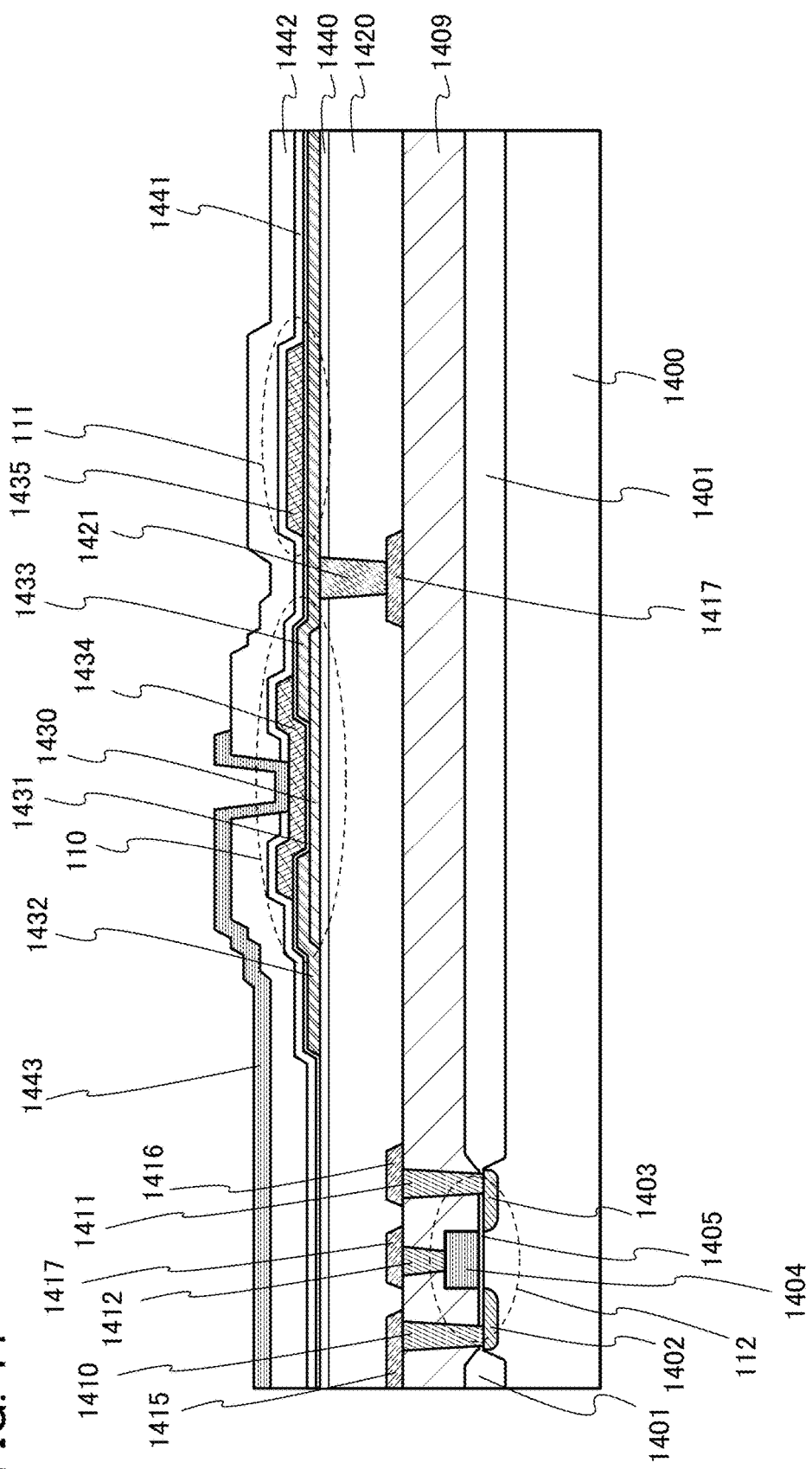
FIG. 11 is a cross-sectional diagram of an example of a semiconductor device.

An example of any of the memory devices and the semiconductor devices which are described in Embodiments 1 to 4 is described. FIG. 11 illustrates an example of a cross-sectional structure of the transistor 110, the transistor 112, and the capacitor 111 included in the memory device 10 illustrated in FIG. 1, FIG. 2, FIG. 3, and FIG. 9.

A channel of the transistor 110 is formed in an oxide semiconductor layer. FIG. 11 illustrates the case where the transistor 110 and the capacitor 111 are formed over the transistor 112 that has a channel formation region in a single crystal silicon substrate.

Note that an active layer in the transistor 112 can be an amorphous, microcrystalline, polycrystalline, or single crystal semiconductor film of silicon, germanium, or the like. Alternatively, an oxide semiconductor may be used for the active layer in the transistor 112. In the case where all of the transistors include an active layer containing an oxide semiconductor, the transistor 110 is not necessarily stacked over the transistor 112, and the transistors 110 and 112 may be formed in the same layer.

When the transistor 112 is formed using a thin silicon film, any of the following can be used, for example: amorphous silicon formed by sputtering or vapor phase growth such as plasma-enhanced CVD, polycrystalline silicon obtained by crystallization of amorphous silicon by laser irradiation, and single crystal silicon obtained by separation of a surface portion of a single crystal silicon wafer by implantation of hydrogen ions or the like into the silicon wafer.

A semiconductor substrate 1400 in which the transistor 112 is formed can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). FIG. 11 illustrates the case of using a single crystal silicon substrate having p-type conductivity as an example.

The transistor 112 is electrically isolated from other transistors by an element isolation insulating film 1401. The element isolation insulating film 1401 can be formed by local oxidation of silicon (LOCOS), trench isolation, or the like.

Specifically, the transistor 112 includes impurity regions 1402 and 1403 that are formed in the semiconductor substrate 1400 and function as source and drain regions, a gate electrode 1404, and a gate insulating film 1405 between the semiconductor substrate 1400 and the gate electrode 1404. The gate electrode 1404 overlaps with a channel formation region formed between the impurity regions 1402 and 1403, with the gate insulating film 1405 placed therebetween.

An insulating film 1409 is provided over the transistor 112. Openings are formed in the insulating film 1409. A wiring 1410 in contact with the impurity region 1402, a wiring 1411 in contact with the impurity region 1403, and a wiring 1412 electrically connected to the gate electrode 1404 are formed in the openings. Note that each of the wirings 1410 to 1412 is also referred to as a plug.

The wiring 1410 is electrically connected to a wiring 1415 over the insulating film 1409. The wiring 1411 is electrically connected to a wiring 1416 over the insulating film 1409. The wiring 1412 is electrically connected to a wiring 1417 over the insulating film 1409.

An insulating film 1420 and an insulating film 1440 are formed to be stacked in this order over the wirings 1415 to 1417. An opening is formed in the insulating films 1420 and 1440. A wiring 1421 electrically connected to the wiring 1417 is formed in the opening. One of a source electrode and a drain electrode of the transistor 110 is electrically connected to the gate electrode 1404 of the transistor 112 through the wiring 1421, the wiring 1417, and the wiring 1412.

In FIG. 11, the transistor 110 and the capacitor 111 are formed over the insulating film 1440.

The transistor 110 includes, over the insulating film 1440, a semiconductor film 1430 containing an oxide semiconductor; conductive films 1432 and 1433 that function as source and drain electrodes and are provided over the semiconductor film 1430; a gate insulating film 1431 over the semiconductor film 1430 and the conductive films 1432 and 1433; and a gate electrode 1434 that is provided over the gate insulating film 1431 and overlaps with the semiconductor film 1430 in the region between the conductive films 1432 and 1433. Note that the conductive film 1433 is electrically connected to the wiring 1421.

A conductive film 1435 is provided over the gate insulating film 1431 to overlap with the conductive film 1433. A portion where the conductive films 1433 and 1435 overlap with each other with the gate insulating film 1431 placed therebetween functions as the capacitor 111.

Although FIG. 11 illustrates an example where the capacitor 111 is provided over the insulating film 1440 together with the transistor 110, the capacitor 111 may be provided below the insulating film 1440 together with the transistor 112.

An insulating film 1441 and an insulating film 1442 are formed to be stacked in this order over the transistor 110 and the capacitor 111. An opening is formed in the insulating films 1441 and 1442. A conductive film 1443 that is in contact with the gate electrode 1434 in the opening is provided over the insulating film 1442.

In FIG. 11, the transistor 110 includes the gate electrode 1434 on at least one side of the semiconductor film 1430. Alternatively, the transistor 110 may include a pair of gate electrodes with the semiconductor film 1430 placed therebetween.

In the case where the transistor 110 has a pair of gate electrodes with the semiconductor film 1430 therebetween, one of the gate electrodes may be supplied with a signal for controlling the on/off state of the transistor 110, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential supplied to the other of the gate electrodes, the threshold voltage of the transistor 110 can be controlled.

In FIG. 11, the transistor 110 has a single-gate structure in which one channel formation region corresponding to the one gate electrode 1434 is provided. However, the transistor 110 may have a multi-gate structure in which a plurality of gate electrodes electrically connected to each other are provided and thus a plurality of channel formation regions are included in the one semiconductor film 1430.

Figure 12A:
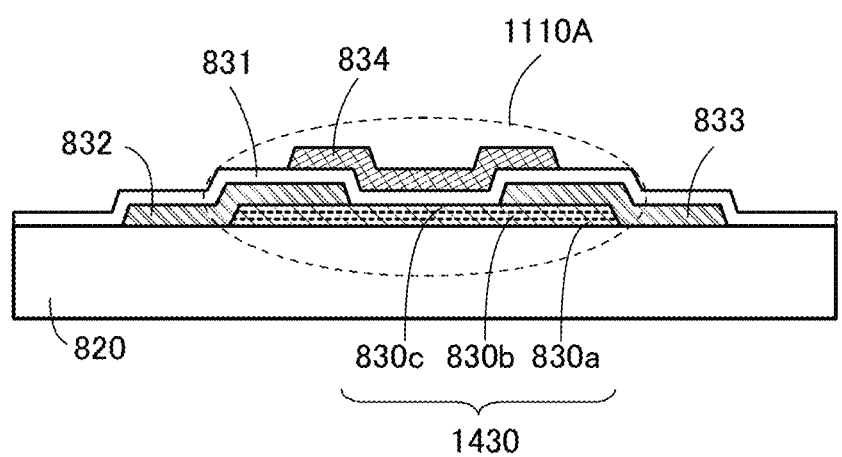
FIGS. 12A and 12B are cross-sectional diagrams of examples of a transistor.

The semiconductor film 1430 is not limited to a single film of an oxide semiconductor and may be a stack including a plurality of oxide semiconductor films. FIG. 12A illusa channel region is formed preferably has a crystalline structure, in which case the transistor can have stable electrical characteristics.

trates an example of a structure of a transistor 1110A in which the semiconductor film 1430 has a three-layer structure.

The transistor 1110A illustrated in FIG. 12A includes the semiconductor film 1430 over an insulating film 820 or the like, conductive films 832 and 833 electrically connected to the semiconductor film 1430, a gate insulating film 831, and a gate electrode 834 provided over the gate insulating film 831 so as to overlap with the semiconductor film 1430.

In the transistor 1110A, as the semiconductor film 1430, oxide semiconductor layers 830a to 830c are stacked in this order from the insulating film 820 side.

The oxide semiconductor layers 830a and 830c are each an oxide film that contains at least one of metal elements contained in the oxide semiconductor layer 830b. The energy at the bottom of the conduction band of the oxide semiconductor layers 830a and 830c is closer to a vacuum level than that of the oxide semiconductor layer 830b by 0.05 eV or more, 0.07 eV or more, 0.1 eV or more, or 0.15 eV or more and 2 eV or less, 1 eV or less, 0.5 eV or less, or 0.4 eV or less. The oxide semiconductor layer 830b preferably contains at least indium in order to increase carrier mobility.

Figure 12B:
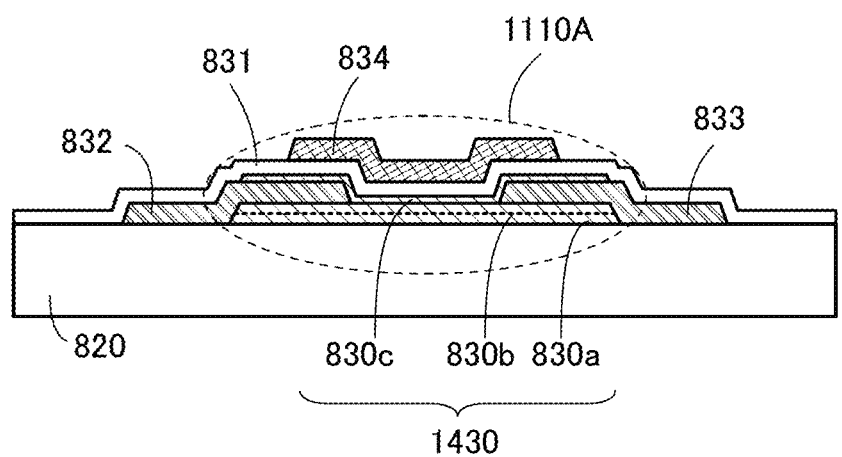

As illustrated in FIG. 12B, part of the oxide semiconductor layer 830c may be placed over the conductive films 832 and 833 so that the gate insulating film 831 overlaps with the oxide semiconductor layer 830c.

Embodiment 6

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 13A to 13F illustrate specific examples of these electronic devices.

Figure 13A:
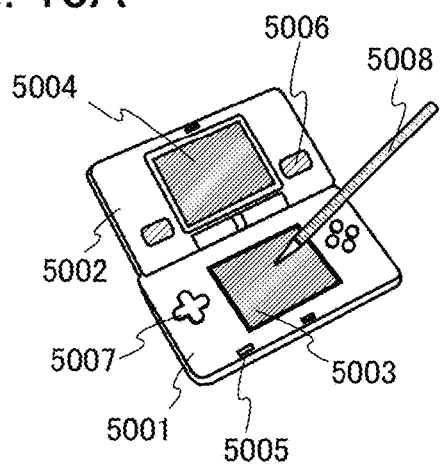
FIGS. 13A to 13F illustrate examples of electronic devices.

FIG. 13A illustrates a portable game console including a housing 5001, a housing 5002, a display portion 5003, a display portion 5004, a microphone 5005, a speaker 5006, an operation key 5007, a stylus 5008, and the like. Note that although the portable game console illustrated in FIG. 13A includes the two display portions 5003 and 5004, the number of display portions included in the portable game console is not limited to two.

Figure 13B:
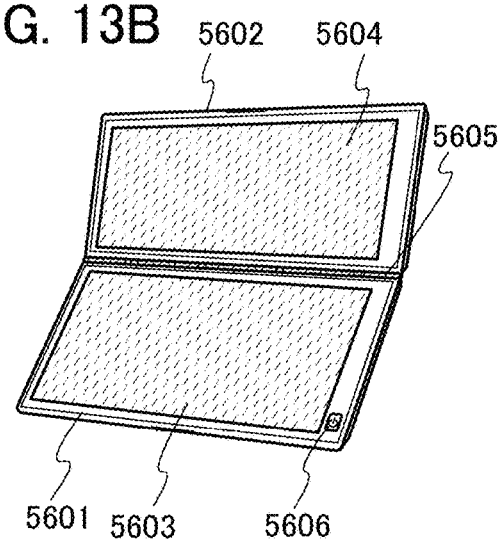

FIG. 13B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 13C:
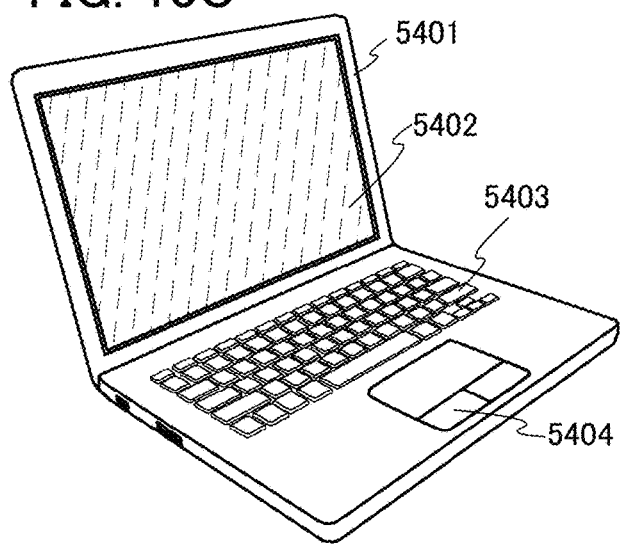

FIG. 13C illustrates a laptop personal computer including a housing 5401, a display portion 5402, a keyboard 5403, a pointing device 5404, and the like.

Figure 13D:
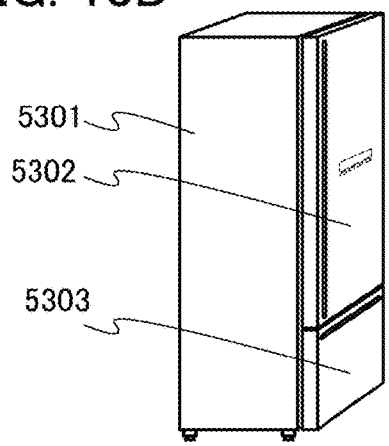

FIG. 13D illustrates an electric refrigerator-freezer, which includes a housing 5301, a refrigerator door 5302, a freezer door 5303, and the like.

Figure 13E:
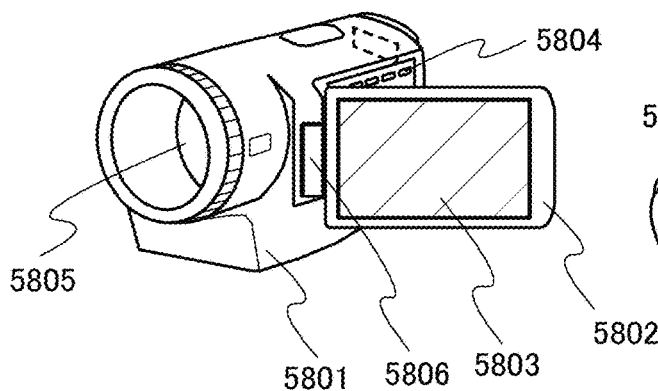

FIG. 13E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 13F:
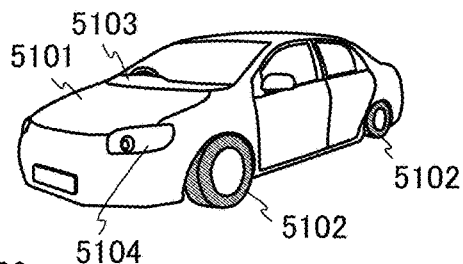

FIG. 13F illustrates a motor vehicle, which includes a car body 5101, wheels 5102, a dashboard 5103, lights 5104, and the like.

This embodiment can be implemented combining with any of the other embodiments as appropriate.

This application is based on Japanese Patent Application serial no. 2013-054496 filed with Japan Patent Office on Mar. 18, 2013, the entire contents of which are hereby incorporated by reference.

What is claimed is:
1. A semiconductor device comprising a memory device, the memory device including:
    a first memory circuit comprising:
        an inverter;
        a clocked inverter;
        a first switch;
        a second switch;
        a third switch; and
        a selection circuit, and
    a second memory circuit comprising:
        a first transistor comprising an oxide semiconductor;
        a second transistor; and
        a capacitor connected to the first transistor,
    wherein one terminal of the first switch is connected to an input terminal of the inverter, an output terminal of the clocked inverter, and one of a source and a drain of the first transistor,
    wherein an output terminal of the inverter is connected to a first input terminal of the selection circuit,
    wherein an output terminal of the selection circuit is connected to an input terminal of the clocked inverter,
    wherein the output terminal of the selection circuit is connected to a first output terminal of the memory device via the second switch,
    wherein the output terminal of the selection circuit is connected to a second output terminal of the memory device via the third switch, wherein one of a source and a drain of the second transistor is connected to a second input terminal of the selection circuit, and wherein a gate of the second transistor is connected to the other of the source and the drain of the first transistor.

2. The semiconductor device according to claim 1, wherein the memory device is a register included in a register file.

3. The semiconductor device according to claim 1, wherein the second transistor includes silicon.

4. The semiconductor device according to claim 1, wherein each of the first switch, the second switch, and the third switch is a transmission gate.

5. The semiconductor device according to claim 1, wherein the oxide semiconductor contains at least indium and zinc.

6. The semiconductor device according to claim 1, wherein a signal including a data is input to the other terminal of the first switch.

7. A semiconductor device comprising a memory device, the memory device including:
 a first memory circuit comprising:
  a NAND logic gate;
  a clocked inverter;
  a first switch;
  a second switch;
  a third switch; and
  a selection circuit, and
 a second memory circuit comprising:
  a first transistor;
  a second transistor; and
  a capacitor connected to the first transistor,
 wherein one terminal of the first switch is connected to a first input terminal of the NAND logic gate, an output terminal of the clocked inverter, and one of a source and a drain of the first transistor,
 wherein an output terminal of the NAND logic gate is connected to a first input terminal of the selection circuit,
 wherein an output terminal of the selection circuit is connected to an input terminal of the clocked inverter,
 wherein the output terminal of the selection circuit is connected to a first output terminal of the memory device via the second switch,
 wherein the output terminal of the selection circuit is connected to a second output terminal of the memory device via the third switch,
 wherein one of a source and a drain of the second transistor is connected to a second input terminal of the selection circuit, and
 wherein a gate of the second transistor is connected to the other of the source and the drain of the first transistor.

8. The semiconductor device according to claim 7, wherein the memory device is a register included in a register file.

9. The semiconductor device according to claim 7,
 wherein the first transistor comprises an oxide semiconductor, and
 wherein the second transistor includes silicon.

10. The semiconductor device according to claim 7, wherein each of the first switch, the second switch, and the third switch is a transmission gate.

11. The semiconductor device according to claim 9, wherein the oxide semiconductor contains at least indium and zinc.

12. The semiconductor device according to claim 7, wherein a signal including a data is input to the other terminal of the first switch.

13. The semiconductor device according to claim 7, wherein a reset signal is input to a second input terminal of the NAND logic gate.

14. The semiconductor device according to claim 13,
 wherein the first transistor comprises silicon,
 wherein a gate of the first transistor is connected to the second input terminal of the NAND logic gate, and
 wherein the first transistor is connected to a third transistor comprising an oxide semiconductor that is included in a third memory circuit.

* * * * *